(12) United States Patent
Ricks et al.

(10) Patent No.: US 7,023,013 B2
(45) Date of Patent: Apr. 4, 2006

(54) ARRAY OF LIGHT-EMITTING OLED MICROCAVITY PIXELS

(75) Inventors: Michele L. Ricks, Rochester, NY (US); Tukaram K. Hatwar, Penfield, NY (US); Jeffrey P. Spindler, Rochester, NY (US); Dustin L. Winters, Webster, NY (US); Joel D. Shore, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/869,115

(22) Filed: Jun. 16, 2004

(65) Prior Publication Data

US 2005/0280008 A1 Dec. 22, 2005

(51) Int. Cl.
   H01L 35/24 (2006.01)
   H01L 33/00 (2006.01)
(52) U.S. Cl. .......................... 257/40; 257/98; 257/103; 313/509
(58) Field of Classification Search ............ 257/40, 257/98, 99, 103; 313/509, 500, 503, 506
   See application file for complete search history.

(56) References Cited

U.S. PATENT DOCUMENTS

| 4,769,292 | A | 9/1988 | Tang et al. |
| 4,885,211 | A | 12/1989 | Tang et al. |
| 5,405,709 | A | 4/1995 | Littman et al. |
| 5,405,710 | A | 4/1995 | Dodabalapur et al. |
| 5,554,911 | A | 9/1996 | Nakayama et al. |
| 5,683,823 | A | 11/1997 | Shi et al. |
| 5,780,174 | A | 7/1998 | Tokito et al. |
| 5,920,080 | A * | 7/1999 | Jones ........................ 257/40 |
| 6,281,634 | B1 | 8/2001 | Yokoyama |
| 6,392,340 | B1 | 5/2002 | Yoneda et al. |
| 6,406,801 | B1 | 6/2002 | Tokito et al. |
| 6,853,133 | B1 * | 2/2005 | Liao et al. ................. 313/504 |
| 2002/0186214 | A1 | 12/2002 | Siwinski |
| 2005/0073228 | A1 * | 4/2005 | Tyan et al. ................ 313/504 |

FOREIGN PATENT DOCUMENTS

| JP | 07-142169 | 6/1995 |
| JP | 11-288786 | 10/1999 |

OTHER PUBLICATIONS

Kido et al., in Science, vol. 267, p. 1332 (1995).
Kido et al., Appl. Phys. Lett., vol. 64, p. 815 (1994).
Deshpande et al., in Appl. Phys. Lett., vol. 75, p. 888 (1999).

* cited by examiner

Primary Examiner—Cuong Nguyen
(74) Attorney, Agent, or Firm—Raymond L. Owens

(57) ABSTRACT

A color OLED display having at least three different colored microcavity pixels, each including a light reflective structure and a semi-transparent structure includes an array of light-emitting microcavity pixels each having one or more common organic light-emitting layers, said light-emitting layer(s) including first and second light-emitting materials, respectively, that produce different light spectra, the first light-emitting material producing light having a first spectrum portion that extends between first and second different colors of the array, and the second light-emitting material producing light having a second spectrum portion that is substantially contained within a third color that is different from the first and second colors, and each different colored pixel being tuned to produce light in one of the three different colors whereby the first, second, and third different colors are produced by the OLED display.

30 Claims, 6 Drawing Sheets

ARRAY OF LIGHT-EMITTING OLED MICROCAVITY PIXELS

CROSS REFERENCE TO RELATED APPLICATIONS

Reference is made to commonly assigned U.S. patent application Ser. No. 10/820,570 filed Apr. 8, 2004, entitled "OLED With Color Change Media" by Michael L. Boroson, et al.; commonly assigned U.S. patent application Ser. No. 10/820,592 filed Apr. 8, 2004, entitled "OLED Device Having Microcavity Subpixels and Color Filter Elements" by Dustin L. Winters; commonly assigned U.S. patent application Ser. No. 10/819,697 filed Apr. 7, 2004, entitled "Color OLED With Added Color Gamut Pixels" by Michael L. Boroson, et al.; commonly assigned U.S. patent application Ser. No. 10/643,837 filed Aug. 19, 2003, entitled "OLED Device Having Microcavity Gamut Subpixels and a Within Gamut Subpixel" by Dustin L. Winters, et al.; commonly assigned U.S. patent application Ser. No. 10/762,675 filed Jan. 22, 2004, entitled "Green Light-Emitting Microcavity OLED Device Using a Yellow Color Filter Element" by Dustin L. Winters, et al.; commonly assigned U.S. patent application Ser. No. 10/680,758 filed Oct. 7, 2003, entitled "White-Emitting Microcavity OLED Device" by Yuan-Sheng Tyan, et al.; commonly assigned U.S. patent application Ser. No. 10/346,424 filed Jan. 17, 2003, entitled "Microcavity OLED Devices" by Yuan-Sheng Tyan, et al.; commonly assigned U.S. patent application Ser. No. 10/356,271 filed Jan. 31, 2003, entitled "Color OLED Display With Improved Emission" by Yuan-Sheng Tyan, et al.; and commonly assigned U.S. patent application Ser. No. 10/368,513 filed Feb. 18, 2003, entitled "Tuned Microcavity Color OLED Display" by Yuan-Sheng Tyan, et al., the disclosures of which are herein incorporated by reference.

FIELD OF THE INVENTION

The present invention relates to an improved tuned microcavity color OLED display device.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full color flat emission displays. Tang et al. described this multilayer OLED device in their U.S. Pat. Nos. 4,769,292 and 4,885,211.

Full color OLED devices are also known in the art. Typical full color OLED devices are constructed of three different color pixels that are red, green, and blue in color. Such an arrangement is known as an RGB design. An example of an RGB design is disclosed in U.S. Pat. No. 6,281,634. Full color organic electroluminescent (EL) devices have also recently been described that are constructed of four different color pixels that are red, green, blue, and white. Such an arrangement is known as an RGBW design. An example of an RGBW device is disclosed in commonly assigned U.S. Patent Application Publication 2002/0186214 A1. In an RGBW device, high efficiency white-emitting pixels are used to display a portion of the digital image content. This results in improved power consumption relative to an RGB device constructed of similar OLED materials.

A white-emitting EL layer can be used to form a multicolor device. Each pixel is coupled with a color filter element as part of a color filter array (CFA) to achieve a pixilated multicolor display. The organic EL layer is common to all pixels and the final color as perceived by the viewer is dictated by that pixel's corresponding color filter element. Therefore a multicolor or RGB device can be produced without requiring any patterning of the organic EL layers. An example of a white CFA top-emitting device is shown in U.S. Pat. No. 6,392,340. Other examples of white light-emitting OLED devices are disclosed in U.S. Pat. No. 5,683,823, JP 07-142169, and U.S. Pat. No. 5,405,709.

Kido et al., in *Science*, Vol. 267, p. 1332 (1995) and in *Appl. Phys. Lett.*, Vol. 64, p. 815 (1994), report a white light-producing OLED device. In this device, three emitter layers with different carrier transport properties, each emitting blue, green, or red light, are used to produce white light. Littman et al. in U.S. Pat. No. 5,405,709 disclose another white-emitting device, which is capable of emitting white light in response to hole-electron recombination, and comprises a fluorescent material in a visible light range from bluish green to red. Recently, Deshpande et al., in *Appl. Phys. Lett.*, Vol. 75, p. 888 (1999), published a white OLED device using red, blue, and green luminescent layers separated by a hole-blocking layer.

A problem in the application of white OLED devices, when used with color filters, is that the intensity of one or more of the red, green, and blue components of the emission spectrum is frequently lower than desired. Therefore, passing the white light from the OLED through the red, green, and blue color filters provides light with a lower efficiency than desired. Consequently, the power that is required to produce a white color in the display by mixing red, green, and blue light can also be higher than desired.

One way of improving the efficiency of an OLED device is the use of a microcavity structure. A reflector and a semitransparent reflector function, with the layers between them, to form a microcavity. The layers between the reflectors can be adjusted in thickness and refractive index so that the resulting optical microcavity resonates at a desired wavelength. Examples of microcavity structures are shown in U.S. Pat. Nos. 5,405,710, 5,554,911, 6,406,801, 5,780,174, and JP 11-288786.

Microcavity devices formed from a common white light-emitting layer, however, have a known problem in that the color gamut of the resultant display is relatively small in comparison to RGB pixilated devices.

SUMMARY OF THE INVENTION

It is therefore an object of the present invention to produce an efficient color OLED display with a large color gamut.

This object is achieved by a color OLED display having at least three different colored microcavity pixels, each including a light reflective structure and a semi-transparent structure, comprising:

a) an array of light-emitting microcavity pixels each having one or more common organic light-emitting layers, said light-emitting layer(s) including first and second light-emitting materials, respectively, that produce different light spectra, the first light-emitting material producing light having a first spectrum portion that extends between first and second different colors of the array, and the second light-emitting material producing light having a second spectrum portion that is substantially contained within a third color that is different from the first and second colors; and b) each different colored pixel being tuned to produce light in one of the three different colors whereby the first, second, and third different colors are produced by the OLED display.

Advantages

It is an advantage of this invention that it provides for a larger color gamut display than prior art devices. It is a further advantage of this invention that low white power consumption can be achieved, due to the deep hues of the primaries.

Figure 1:
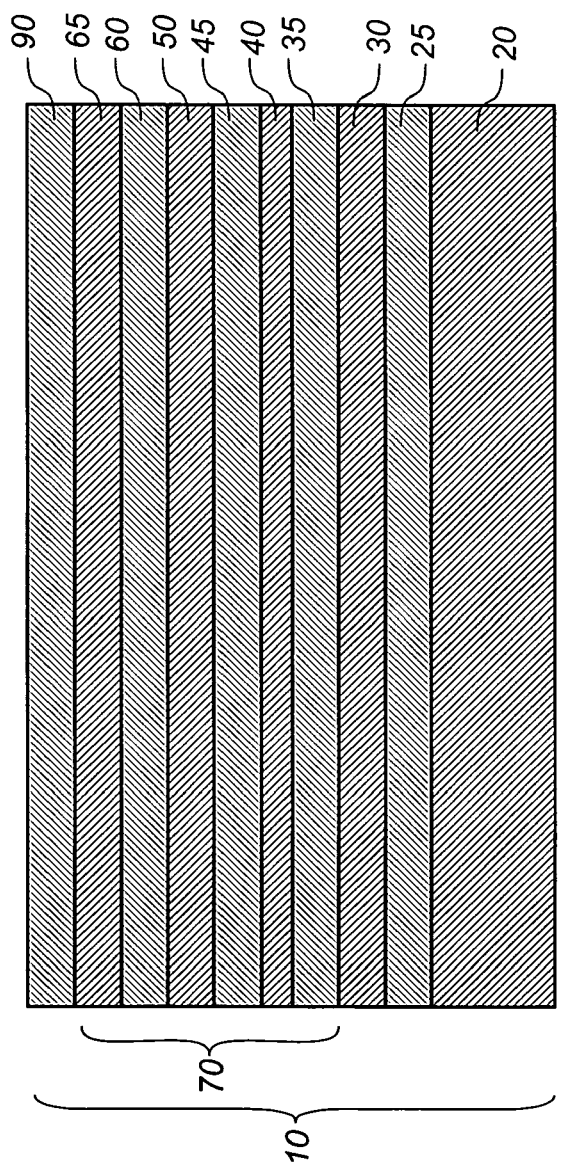
FIG. 1 is a cross-sectional view of a single light-emitting microcavity pixel of a color OLED display according to this invention.

Since device feature dimensions such as layer thicknesses are frequently in submicrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors can be produced by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. It is recognized that in full color systems, several pixels of different colors will be used together to produce a broad range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. A broadband blue-green-emitting material emits light such that the emission maximum and full width at half maximum is contained between 400 nm and 550 nm of the visible spectrum. A broadband yellow-emitting material emits light such that the emission maximum and full width at half maximum is contained between 530 nm and 700 nm of the visible spectrum. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a multicolor or full color display. Although CIEx, CIEy coordinates of about 0.33, 0.33 can be ideal in some circumstances, the actual coordinates can vary significantly and still be very useful.

The term substantially contained within the red portion of the visible spectrum refers to that light such that the emission maximum and full width at half maximum is contained between 560 nm and 700 nm.

The term substantially contained within the blue portion of the visible spectrum refers to that light such that the emission maximum and full width at half maximum is contained between 400 nm and 490 nm.

Figure 3A:
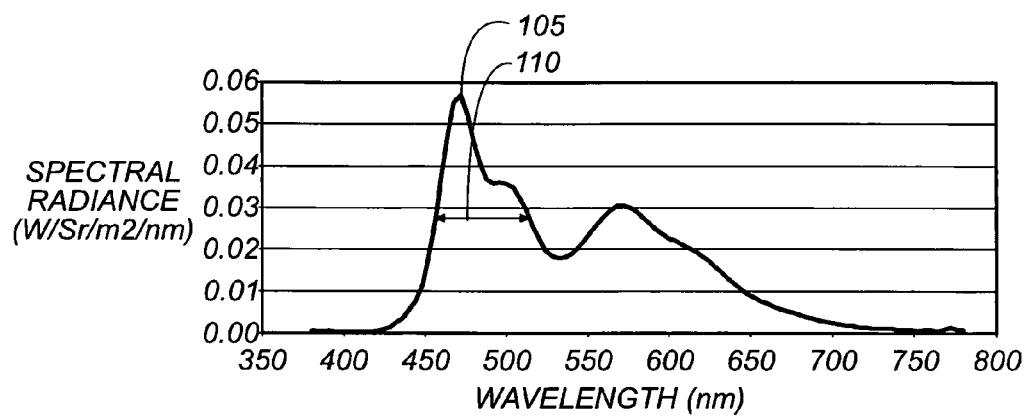
FIG. 3A is an emission spectrum of a comparative white light-emitting OLED device.
Figure 3B:
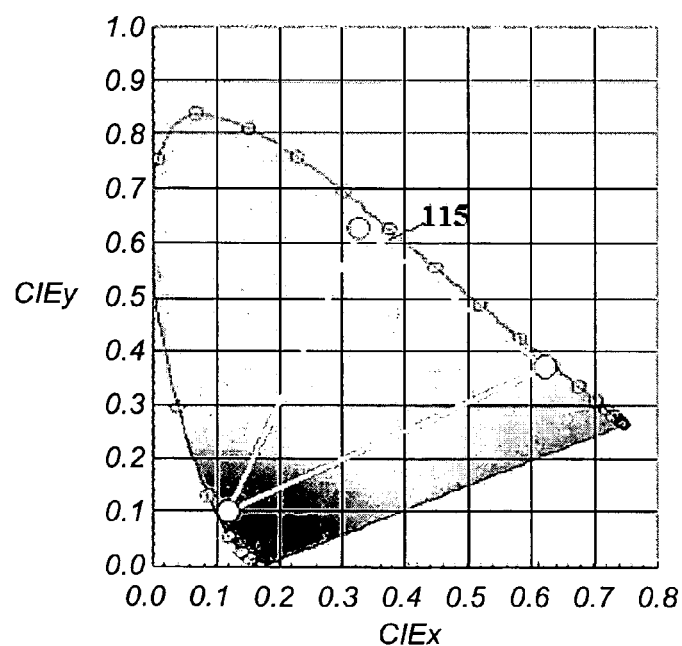
FIG. 3B is a 1931 CIE x,y-chromaticity diagram showing the color gamut modeled with the above comparative white light-emitting OLED device.
Figure 4A:
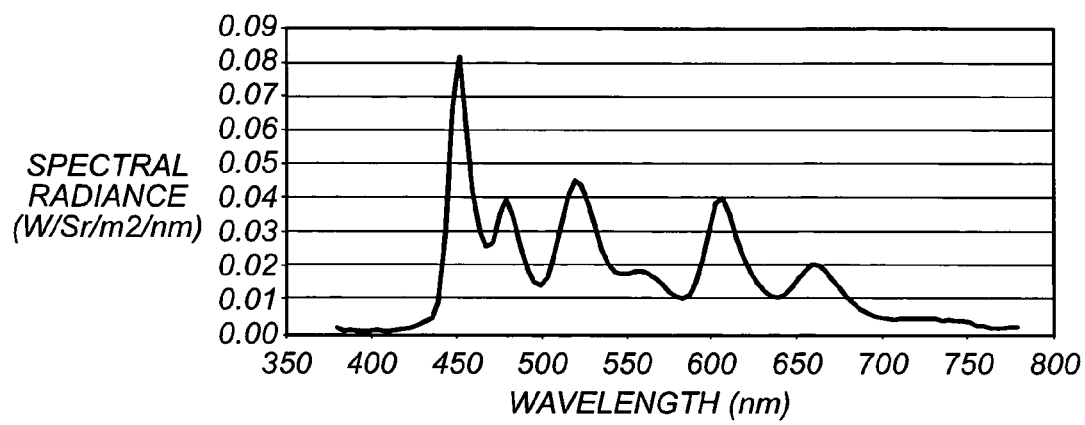
FIG. 4A is an emission spectrum of a second comparative white light-emitting OLED device.
Figure 4B:
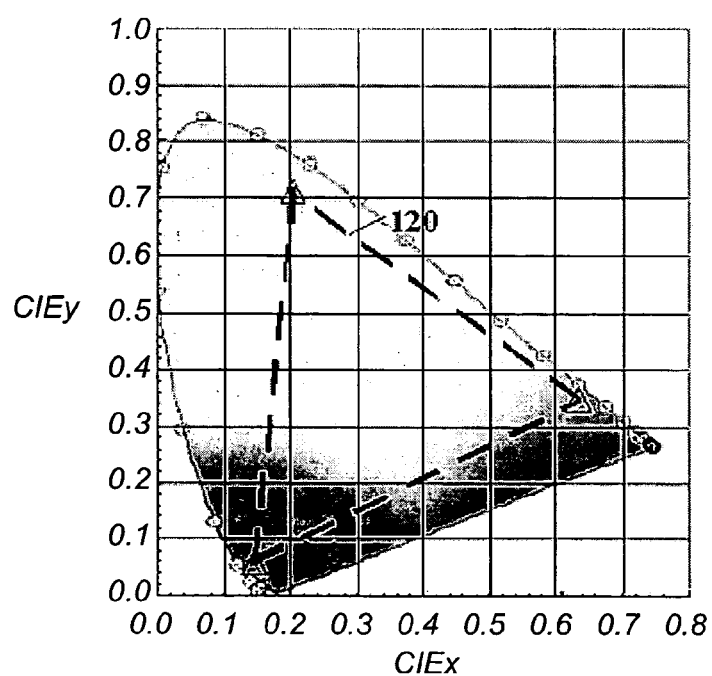
FIG. 4B is a 1931 CIE x,y-chromaticity diagram showing the color gamut modeled with the above second comparative white light-emitting OLED device.

Red light-emitting materials in accordance with this invention are referred to as having narrow band emission, meaning the full width at half maximum is between 5 nm and 90 nm. Blue light-emitting materials in accordance with this invention are referred to as having narrow band emission, meaning the full width at half maximum is between 5 nm 25 nm. By emission maximum, it is meant a wavelength of maximum emission, also called $\lambda_{max}$ (e.g., $\lambda_{max}$ 105 in FIG. 3A). By full width at half maximum, it is meant the width of a given emission peak at one-half its maximum value, e.g., full width at half maximum 110 in FIG. 3A. For the purposes of this invention, a narrow band emitting material is combined with a complementary broadband emitting material, to produce white light emission.

The present invention can be employed in most OLED device configurations. These include very simple structures comprising a single anode and cathode, to more complex devices including passive matrix displays comprised of orthogonal arrays of anodes and cathodes to form pixels, and active matrix displays where each pixel is controlled independently, for example, with thin film transistors (TFTs). OLED devices of this invention can operate under forward biasing and so can function under Direct Current (DC) mode. It is sometimes advantageous to apply a reverse bias, e.g. in an alternating current (AC) mode. The OLED typically does not emit light under reverse bias, but significant stability enhancements have been demonstrated, as described in U.S. Pat. No. 5,552,678.

Turning now to FIG. 1, there is shown a cross-sectional view of a single light-emitting microcavity pixel 10 of a light-emitting color OLED display according to the present invention. Microcavity pixel 10 is a bottom-emitting device, however, alternate embodiments where the microcavity pixel is a top-emitting device are also possible and are envisioned as being within the scope of the present invention. A bottom-emitting device is a device where the substrate is between the light-emitting layers and the viewer when viewed such that light passes through the substrate and the viewer views the device from the side of the substrate. A top-emitting device is a device where the light-emitting layers are between the substrate and the viewer and is viewed from the opposite side of the substrate compared to a bottom-emitting device. The OLED device includes at a minimum a substrate 20, a semitransparent reflector 25, a reflector 90 spaced from semitransparent reflector 25, a first light-emitting layer 45, and a second light-emitting layer 50. Each light-emitting layer includes respective light-emitting material that is designed to produce different light spectra in response to hole-electron recombination. The first light-emitting layer material, in first light-emitting layer 45, produces light having a first spectrum portion that is either substantially contained within a first color, e.g. red, or spans two colors of the visible spectrum, e.g. red and yellow. The second light-emitting layer material, in second light-emitting layer 50, produces light having a second spectrum portion that is either substantially contained within a second color different from the first color, e.g. blue, or spans two colors of the visible spectrum, e.g. blue and green. For the purpose of this invention, the light-emitting materials in the two light-emitting layers should be complementary, e.g. if the first light-emitting material produces substantially blue light, the second light-emitting material produces broadband yellow light.

Microcavity pixel 10 includes a microcavity structure that is tuned to produce light in one of the three colors of the light-emitting layers 45 and 50. The pixel can also include cavity spacer layer 30, a hole-injecting layer 35, a hole-transporting layer 40, an electron-transporting layer 60, and an electron-injecting layer 65. Hole-injecting layer 35, hole-transporting layer 40, light-emitting layers 45 and 50, electron-transporting layer 60, and electron-injecting layer 65 comprise organic EL element 70 that is disposed between semitransparent reflector 25 and reflector 90. These components will be described in more detail.

Microcavity pixel 10 is arranged such that light produced in the organic EL element 70 passes through semitransparent reflector 25 and substrate 20. This configuration where light travels through the substrate is known as a bottom-emitting device. In this configuration, substrate 20 is preferably highly transparent and is constructed of a material such as glass or plastic. Alternately, the device could be fabricated with the reflector between the substrate and the organic EL medium. This alternate configuration is known as a top-emitting device. In a top-emitting device, light does not pass through the substrate and the substrate can therefore be optionally opaque. This configuration enables the use of a large variety of substrates. Example substrates that can be used with a top-emitting configuration include semiconductors, metallic foils, and ceramics.

Substrate 20 can be rigid or flexible and can be processed as separate individual pieces, such as sheets or wafers, or as a continuous roll. Substrate 20 can be a homogeneous mixture of materials, a composite of materials, or multiple layers of materials. The substrate can further include active matrix circuitry (not shown) to drive the microcavity device.

Light produced in the organic EL element 70 exits the device through the semitransparent reflector 25, which is designed to be partially transmitting and partially reflecting at the wavelength of interest. Semitransparent reflector 25 could be constructed of a thin metal layer such as Ag or an alloy of Ag, which is preferably between 5 nm and 35 nm in thickness. Ag is a preferred metal since, when formed in a thin layer, it is reflective and transparent with low absorbance. Other metals such as Au or Al can also be made to work. The cavity spacer 12 is constructed of a transparent material such as ITO, IZO, or the like. In this example, the cavity spacer layer also serves as the first electrode for the OLED device. The first electrode is commonly configured as the anode. However, the practice of this invention is not limited to this configuration, and can instead have a cathode as the first electrode. For the purposes of this discussion, the first electrode is considered the anode. While the cavity spacer layer is shown as a single layer, it can alternately be composed of several layers of different materials. The reflector 25 is preferably constructed of a highly reflective metal including, but not limited to, Al, Ag, Au, and alloys thereof. In this example, the reflector also serves as the second electrode for the OLED device. The second electrode is commonly configured as the cathode. However, the practice of this invention is not limited to this configuration, and can instead have an anode as the second electrode. For the purposes of this discussion, the second electrode is considered the cathode.

Microcavity pixel 10 is an example embodiment of a microcavity device structure. Several variations are known in the art and can also be applied to the present invention. For example, the semitransparent reflector could be constructed from a quarter wave stack (QWS) of several alternating layers of transparent materials having different refractive indexes. An example of an OLED microcavity device with a QWS is shown in U.S. Pat. No. 5,405,710. In another alternate embodiment, the cavity spacer layer could alternately be placed between the reflector and the organic EL medium, or it could be limited entirely. In either of these cases, the semitransparent reflector would then need to serve as the first electrode for the OLED device.

While not always necessary, it is often useful that a hole-injecting layer 35 be formed over the anode in an organic light-emitting display. The hole-injecting material can serve to improve the film formation property of subsequent organic layers and to facilitate injection of holes into the hole-transporting layer. Suitable materials for use in hole-injecting layer 35 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 40 be formed and disposed over the anode. Desired hole-transporting materials can be deposited by any suitable way such as evaporation, sputtering, chemical vapor deposition, electrochemical means, thermal transfer, or laser thermal transfer from a donor material. Hole-transporting materials useful in hole-transporting layer 40 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A

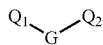

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B

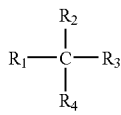

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D

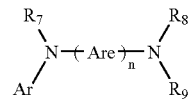

D wherein:

each Are is an independently selected arylene group, such as a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;

N,N,N',N'-Tetra(2-naphthyl)-4,4"-diamino-p-terphenyl;
4,4'-Bis {N-phenyl-N-[4-(1-naphthyl)-phenyl] amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Some hole-injecting materials described in EP 0 891 121 A1 and EP 1 029 909 A1 can also make useful hole-transporting materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layers 45 and 50 produce light in response to hole-electron recombination. A light-emitting layer is commonly disposed over hole-transporting layer 40 in an OLED display. Desired organic light-emitting materials can be deposited by any suitable way such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. A light-emitting layer can be comprised of a single material, but more commonly includes a host doped with a guest compound or dopant where light emission comes primarily from the dopant. First light-emitting layer 45 includes a first host and second light-emitting layer 50 includes a second host. Both of the hosts can be the same material. Both of the hosts can comprise a single host material or a mixture of host materials. The dopant is selected to produce colored light having a particular spectrum. First light-emitting layer 45 includes a light-emitting compound of the first color, e.g. a red light-emitting compound. Second light-emitting layer 50 includes a light-emitting compound of a second complementary color that spans two portions of the visible spectrum, e.g. a blue and green light-emitting compound. The practice of this invention is not restricted to this ordering of layers. For example, second light-emitting layer 50 can include a blue light-emitting compound, and first light-emitting layer 45 can include a yellow light-emitting compound. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also potentially useful. Dopants are typically coated as 0.01 to 10% by weight into the host material. Lanthanide emitters, for example as set forth in WO 98/58037 and WO 00/32718, are useful. In this invention, however, one of the light-emitting materials must satisfy the emission maximum and full width at half maximum requirements as set forth previously for narrow band emission and the second light-emitting material must be a complementary broadband emitter.

The host and emitting materials can be small nonpolymeric molecules or polymeric materials including polyfluorenes and polyvinylarylenes, e.g., poly(p-phenylenevinylene), PPV. In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential, which is defined as the energy difference between the highest occupied molecular orbital and the lowest unoccupied molecular orbital of the molecule. For efficient energy transfer from the host to the emitting material, a necessary condition is that the bandgap of the dopant is smaller than that of the host material. For phosphorescent emitters (including materials that emit from a triplet excited state, i.e., so-called "triplet emitters") it is also important that the triplet energy level of the host be high enough to enable energy transfer from host to emitting material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red

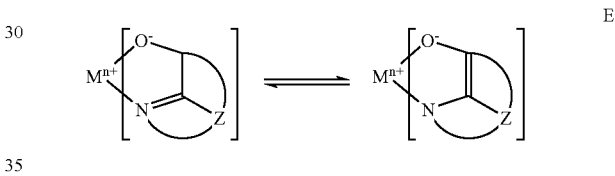

E wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium] CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]; and

CO-9: Zirconium oxine [alias, tetra(8-quinolinolato)zirconium(IV)].

The host material in one or more of the light-emitting layers of this invention can be an anthracene derivative having hydrocarbon or substituted hydrocarbon substituents at the 9 and 10 positions. For example, derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red

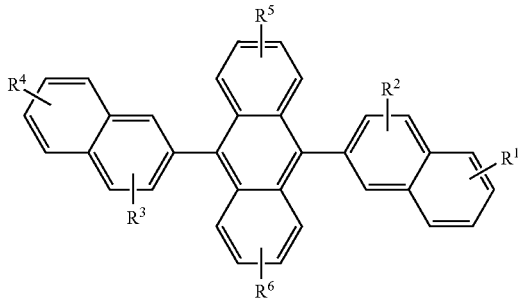

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxyamino, alkylamino, or arylamino of from 1 to 24 carbon atoms; and Group 6: fluorine, chlorine, bromine or cyano.

The monoanthracene derivative of Formula (I) is also a useful host material capable of supporting electroluminescence, and are particularly suitable for light emission of wavelengths longer than 400 nm, e.g., blue, green, yellow, orange or red. Anthracene derivatives of Formula (I) is described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference,

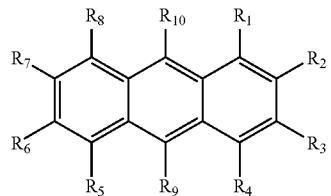

wherein:
  $R_1$–$R_8$ are H; and
  $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and
  $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula (II)

$$A\ 1\text{—}L\text{—}A\ 2 \qquad (II)$$

wherein A 1 and A 2 each represent a substituted or unsubstituted monophenyl-anthryl group or a substituted or unsubstituted diphenylanthryl group and can be the same with or different from each other and L represents a single bond or a divalent linking group.

Another useful class of anthracene derivatives is represented by general formula (III)

$$A\ 3\text{—}An\text{—}A\ 4 \qquad (III)$$

wherein An represents a substituted or unsubstituted divalent anthracene residue group, A 3 and A 4 each represent a substituted or unsubstituted monovalent condensed aromatic ring group or a substituted or unsubstituted non-condensed ring aryl group having 6 or more carbon atoms and can be the same with or different from each other.

Asymmetric anthracene derivatives as disclosed in U.S. Pat. No. 6,465,115 and WO 2004/018587 are useful hosts and these compounds are represented by general formulas (IV) and (V) shown below, alone or as a component in a mixture

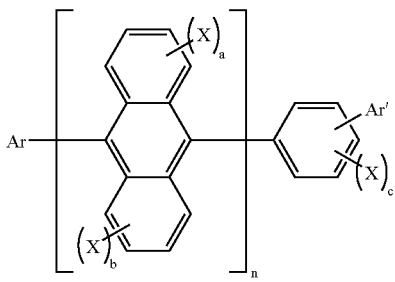
(IV)

wherein:
- Ar is an (un)substituted condensed aromatic group of 10–50 nuclear carbon atoms;
- Ar' is an (un)substituted aromatic group of 6–50 nuclear carbon atoms;
- X is an (un)substituted aromatic group of 6–50 nuclear carbon atoms, (un)substituted aromatic heterocyclic group of 5–50 nuclear carbon atoms, (un)substituted alkyl group of 1–50 carbon atoms, (un)substituted alkoxy group of 1–50 carbon atoms, (un)substituted aralkyl group of 6–50 carbon atoms, (un)substituted aryloxy group of 5–50 nuclear carbon atoms, (un)substituted arylthio group of 5–50 nuclear carbon atoms, (un)substituted alkoxycarbonyl group of 1–50 carbon atoms, carboxy group, halogen atom, cyano group, nitro group, or hydroxy group;
- a, b, and c are whole numbers of 0–4; and n is a whole number of 1–3;
- and when n is 2 or more, the formula inside the parenthesis shown below can be the same or different

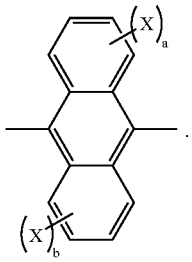

Furthermore, the present invention provides anthracene derivatives represented by general formula (V) shown below

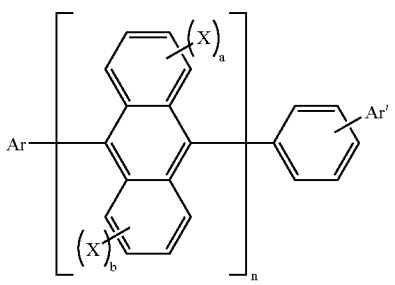
(V)

wherein:
- Ar is an (un)substituted condensed aromatic group of 10–50 nuclear carbon atoms;
- Ar' is an (un)substituted aromatic group of 6–50 nuclear carbon atoms;
- X is an (un)substituted aromatic group of 6–50 nuclear carbon atoms, (un)substituted aromatic heterocyclic group of 5–50 nuclear carbon atoms, (un)substituted alkyl group of 1–50 carbon atoms, (un)substituted alkoxy group of 1–50 carbon atoms, (un)substituted aralkyl group of 6–50 carbon atoms, (un)substituted aryloxy group of 5–50 nuclear carbon atoms, (un)substituted arylthio group of 5–50 nuclear carbon atoms, (un)substituted alkoxycarbonyl group of 1–50 carbon atoms, carboxy group, halogen atom, cyano group, nitro group, or hydroxy group;
- a, b, and c are whole numbers of 0–4; and n is a whole number of 1–3; and
- when n is 2 or more, the formula inside the parenthesis shown below can be the same or different

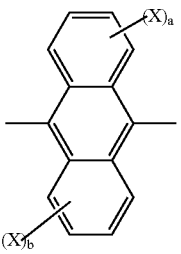

Specific examples of useful anthracene materials for use in a light-emitting layer include

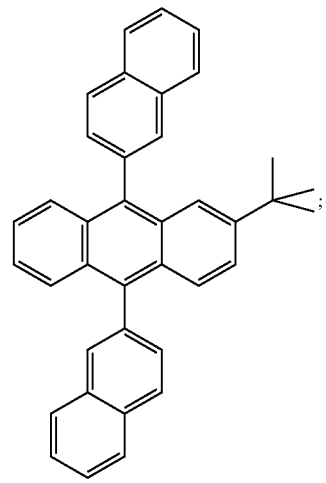

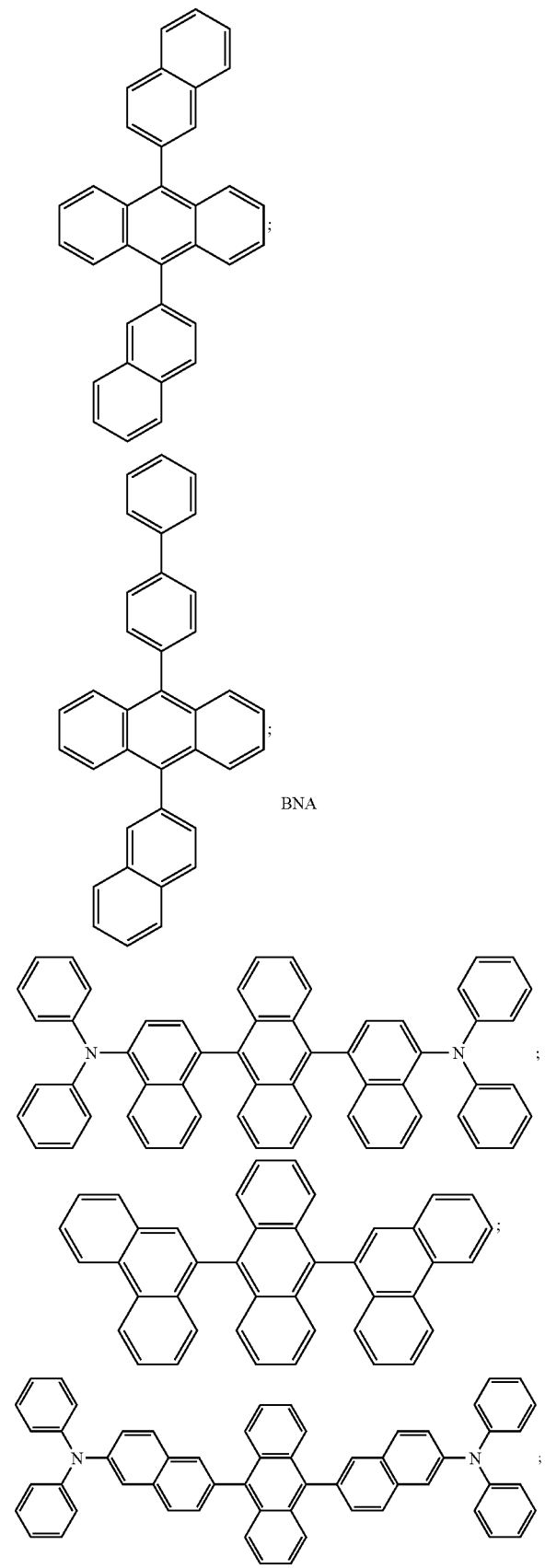
Benzazole derivatives (Formula G) constitute another class of useful host materials capable of supporting electroluminescence, and are particularly suitable for light emission of wavelengths longer than 400 nm, e.g., blue, green, yellow, orange or red

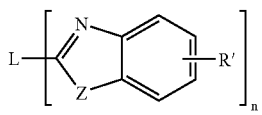

where:
n is an integer of 3 to 8;
Z is O, NR or S;
R' is hydrogen; alkyl of from 1 to 24 carbon atoms, for example, propyl, t-butyl, heptyl, and the like; aryl or heteroatom-substituted aryl of from 5 to 20 carbon atoms for example phenyl, naphthyl, furyl, thienyl, pyridyl, quinolinyl and other heterocyclic systems; or halo such as chloro, fluoro; or atoms necessary to complete a fused aromatic ring; and
L is a linkage unit including alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Certain of the hole-transporting materials described above, e.g. 4,4'-bis[N-(1-naphthyl)-N-phenylamino]biphenyl and 4,4'-bis[N-(2-naphthyl)-N-phenylamino]biphenyl, can also be useful hosts for one or more of the light-emitting layers of this invention.

Also useful as co-hosts in certain light-emitting layers of this invention are derivatives of tetracene, which will be seen to be particularly useful in the red or yellow light-emitting layer of this invention

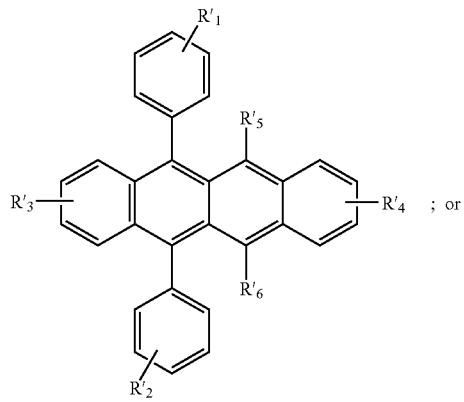

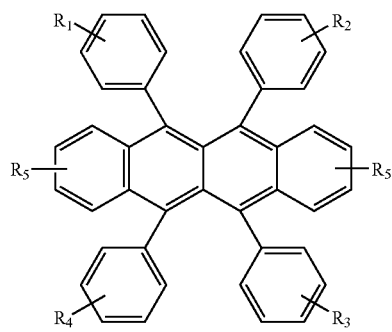

wherein $R_1$–$R_6$ represent one or more substituents on each ring and where each substituent is individually selected from one of the following:

Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;
Category 5: alkoxylamino, alkylamino, or arylamino of from 1 to 24 carbon atoms; or
Category 6: fluoro, chloro, bromo or cyano.

Desirable host materials are capable of forming a continuous film. The light-emitting layer can contain more than one host material in order to improve the device's film morphology, electrical properties, light emission efficiency, and lifetime. The light-emitting layer can contain a first host material that has effective hole-transporting properties, and a second host material that has effective electron-transporting properties.

Desirable fluorescent dopants for OLED displays commonly include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds. Among derivatives of distyrylbenzene, particularly useful are those substituted with diarylamino groups, informally known as distyrylamines. Illustrative examples of dopants include, but are not limited to, the following:

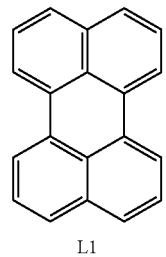

L1

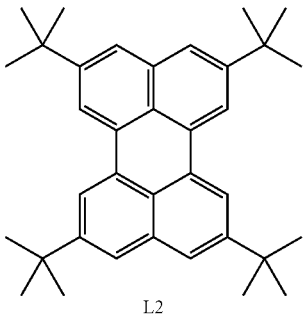

L2

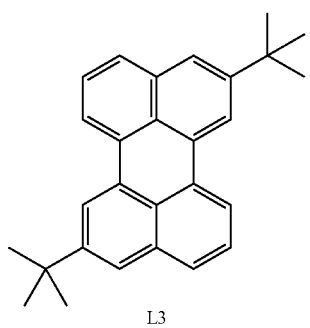
L3
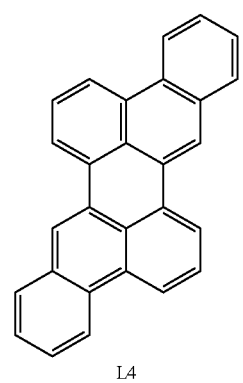
L4
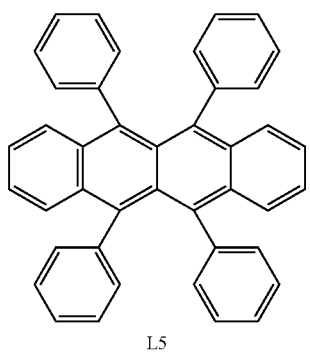
L5
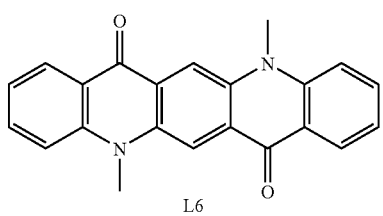
L6
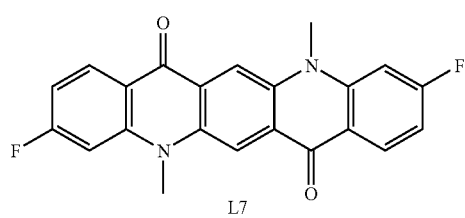
L7
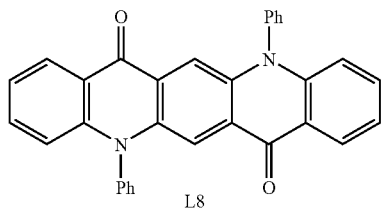
L8
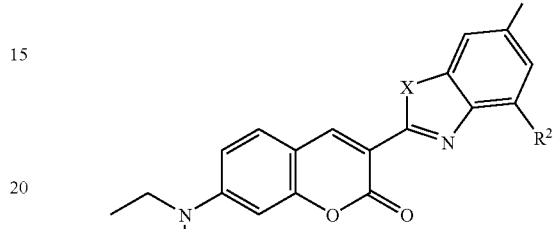
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
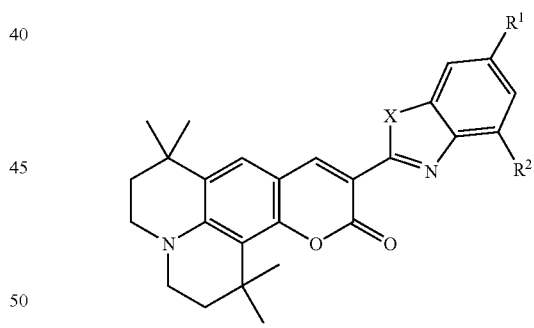
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued
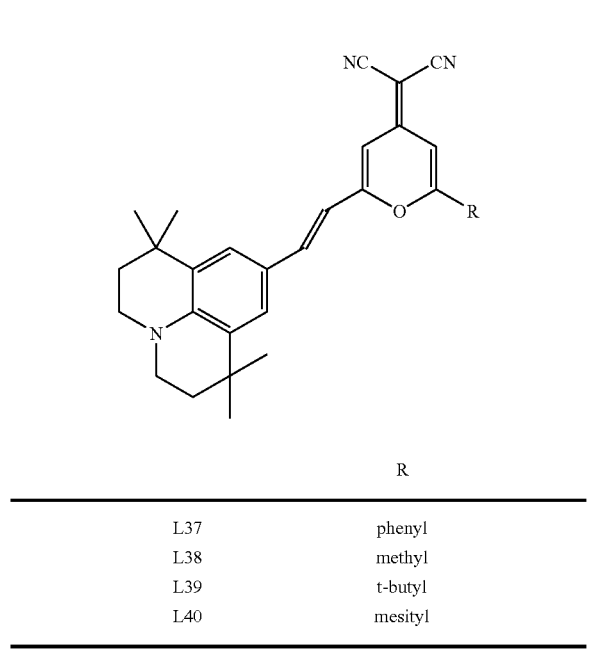
| | R |
|---|---|
| L37 | phenyl |
| L38 | methyl |
| L39 | t-butyl |
| L40 | mesityl |
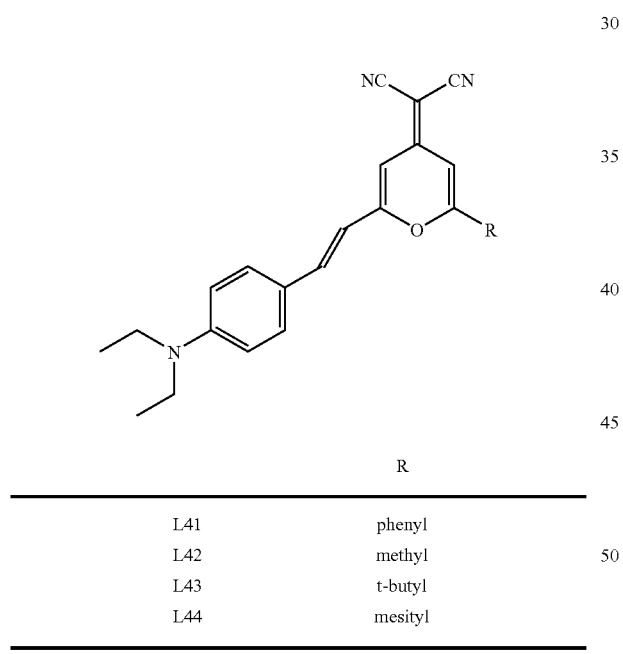
| | R |
|---|---|
| L41 | phenyl |
| L42 | methyl |
| L43 | t-butyl |
| L44 | mesityl |
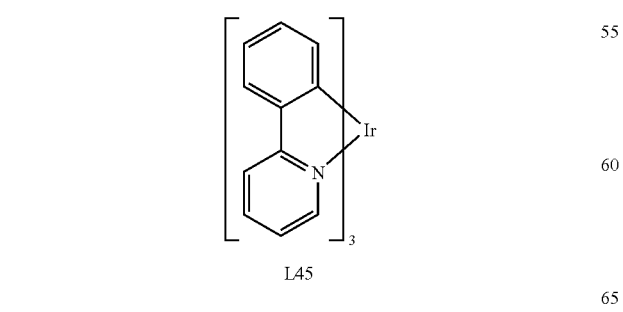
L45
-continued
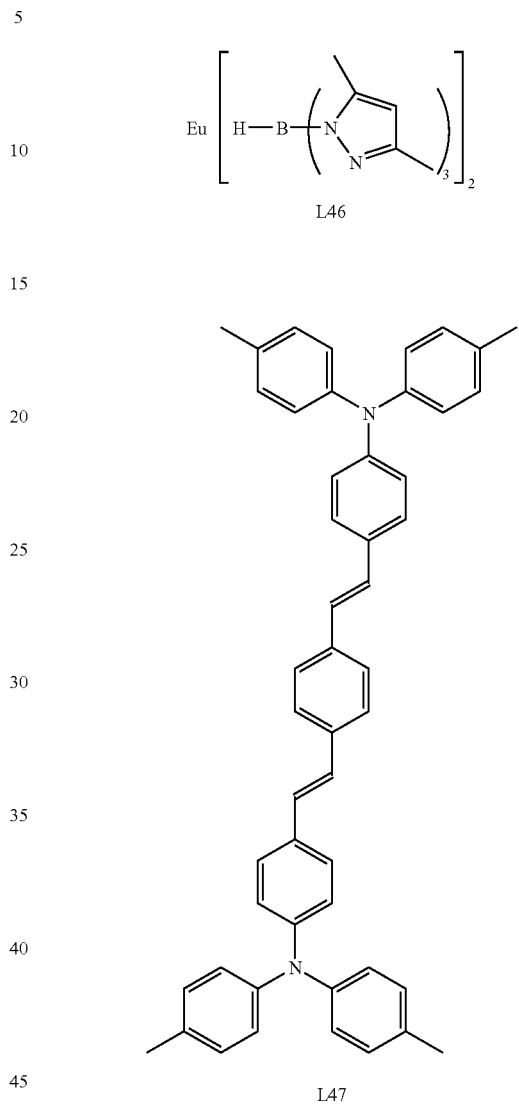
L46
L47
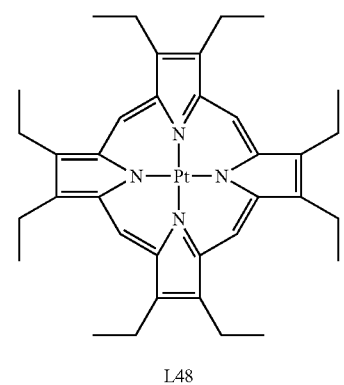
L48

-continued

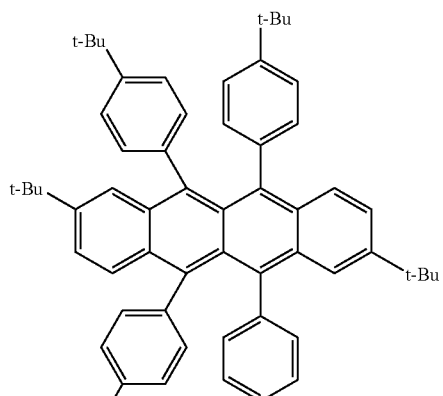

L49

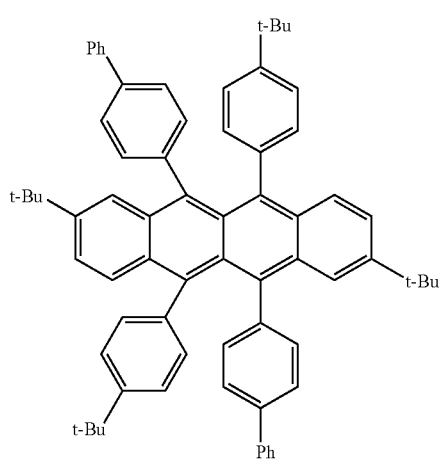

L50

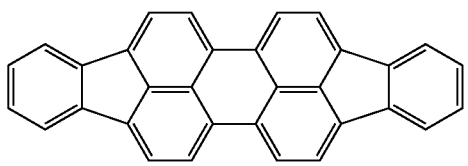

L51

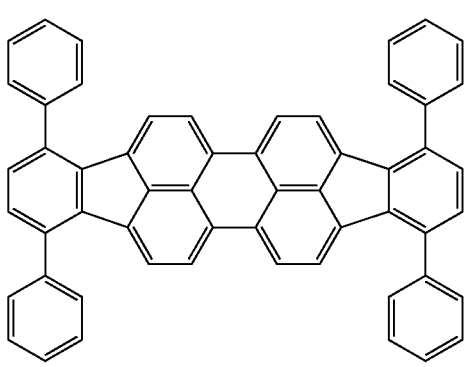

L52

-continued

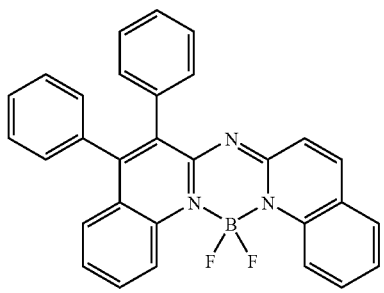

L53

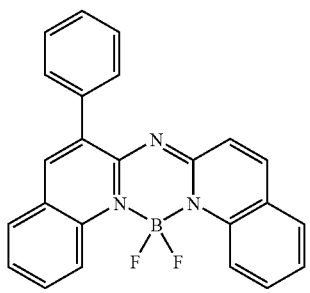

L54

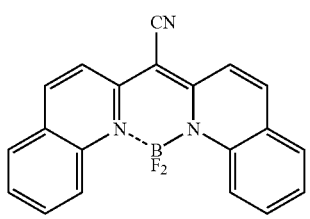

L55

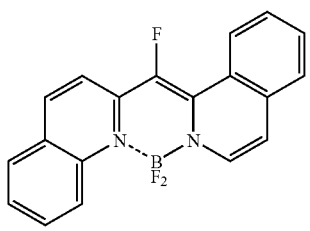

L56

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Examples of useful phosphorescent materials that can be used in light-emitting layers of this invention include, but are not limited to, those described in WO 00/57676, WO 00/70655, WO 01/41512 A1, WO 02/15645 A1; U.S. Patent Application Publication 2003/0017361 A1; WO 01/93642 A1, WO 01/39234 A2; U.S. Pat. No. 6,458,475; WO 02/071813 A1; U.S. Pat. No. 6,573,651; U.S. Patent Application Publication 2002/0197511 A1; WO 02/074015 A2; U.S. Pat. No. 6,451,455; U.S. Patent Application Publications 2003/0072964 A1, 2003/0068528 A1; U.S. Pat. Nos. 6,413,656, 6,515,298, 6,451,415, 6,097,147; U.S. Patent Application Publications 2003/0124381 A1, 2003/0059646 A1, 2003/0054198 A1; EP 1 239 526 A2, EP 1 238 981 A2, EP 1 244 155 A2; U.S. Patent Application Publications 2002/0100906 A1, 2003/0068526 A1, 2003/0068535 A1; JP 2003/073387A, JP 2003/073388A; U.S. Patent Application Publications 2003/0141809 A1, 2003/0040627 A1; JP 2003/059667A, JP 2003/073665A; and U.S. Patent Application Publication 2002/0121638 A1.

The emission wavelengths of cyclometallated Ir(III) complexes of the type IrL$_3$ and IrL$_2$L', such as the green-emitting fac-tris(2-phenylpyridinato-N,C$^{2'}$)Iridium(III) and bis(2-phenylpyridinato-N,C$^{2'}$)Iridium(III)(acetylacetonate) can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N, C$^3$)Iridium(III)(acetylacetonate) and tris(1-phenylisoquinolinato-N,C)Iridium(III). A blue-emitting example is bis(2-(4,6-diflourophenyl)-pyridinato-N,C$^{2'}$)Iridium(III) (picolinate).

Red electrophosphorescence has been reported using bis (2-(2'-benzo[4,5-a]thienyl)pyridinato-N,C$^3$) iridium (acetylacetonate) [Btp$_2$Ir(acac)] as the phosphorescent material in Adachi, C., Lamansky, S., Baldo, M. A., Kwong, R. C., Thompson, M. E., and Forrest, S. R., *App. Phys. Lett.*, 78, 1622–1624 (2001).

Still other examples of useful phosphorescent materials include coordination complexes of the trivalent lanthanides such as Tb$^{3+}$ and Eu$^{3+}$, J. Kido et al, *Appl. Phys. Lett.*, 65, 2124 (1994).

Suitable host materials for phosphorescent emitters (including materials that emit from a triplet excited state, i.e. so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-(N,N'-dicarbazole)biphenyl, m-(N,N'-dicarbazole)benzene, and poly(N-vinylcarbazole), including their derivatives.

In addition to suitable hosts, an OLED device employing a phosphorescent material often requires at least one exciton- or hole-blocking layer to help confine the excitons or electron-hole recombination centers to the light-emitting layer comprising the host and phosphorescent material. In one embodiment, such a blocking layer would be placed between a phosphorescent light-emitting layer and the cathode, and in contact with the phosphorescent light-emitting layer. In this case, the ionization potential of the blocking layer should be such that there is an energy barrier for hole migration from the host into the electron-transporting layer (or the metal-doped organic layer), while the electron affinity should be such that electrons pass more readily from the electron-transporting layer (or the metal-doped organic layer) into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)Aluminum(III) (BAlQ). Metal complexes other than Balq are also known to block holes and excitons as described in U.S. Patent Application Publication 2003/0068528 A1. U.S. Patent Application Publication 2003/0175553 A1 describes the use of fac-tris(1-phenylpyrazolato-N,C$^2$)iridium(III) (Irppz) in an electron/exciton blocking layer.

Certain red and blue light-emitting materials can be particularly useful for this invention. Prior art displays which emit white light have included emitting layers that produce a broad range of emitted wavelengths, e.g. EP 1 187 235 A2, which teaches a white light-emitting organic electroluminescent element with a substantially continuous spectrum in the visible region of the spectrum. Other examples are described in, for example EP 1 187 235; U.S. Patent Application Publication 2002/0025419; EP 1 182 244; U.S. Pat. Nos. 5,683,823, 5,503,910, 5,405,709, and 5,283,182. These will be referred to herein as broadband white emitters or broadband emitters. In contrast, it has been found that a light-emitting layer (or series of layers) with at least one narrow well-defined maxima in the spectrum can be particularly useful when combined with a series of microcavity structures.

For this invention, it has been found useful that a red light-emitting compound have an emission maximum between 560 nm and 700 nm, and a full width at half maximum of between 5 nm and 90 nm contained within the wavelength range of 560 nm and 700 nm. It is preferable that the red light-emitting compound have a full width at half maximum of between 5 nm and 40 nm contained within the wavelength range of 575 nm and 640 nm. The red light-emitting compound can include a diindenoperylene compound of the following structure:

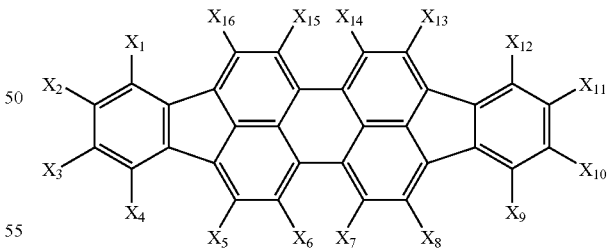

wherein $X_1$–$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide a full width at half maximum of between 5 nm and 90 nm contained within the wavelength range of 560 nm and 700 nm.

Illustrative examples of useful red dopants of this class include the following:
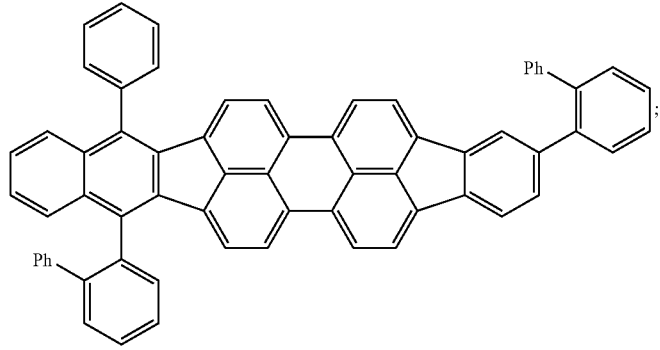
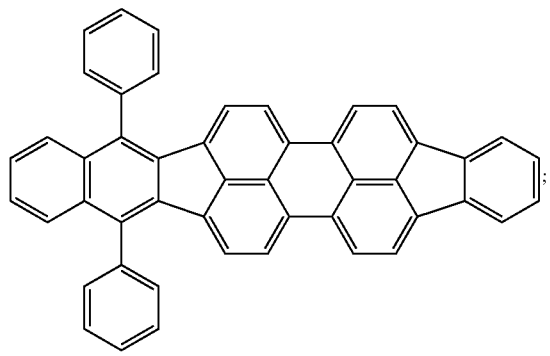
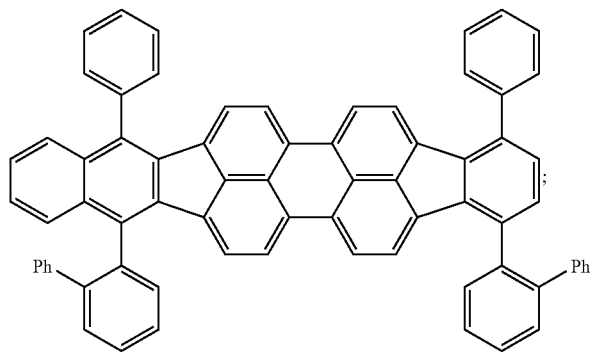
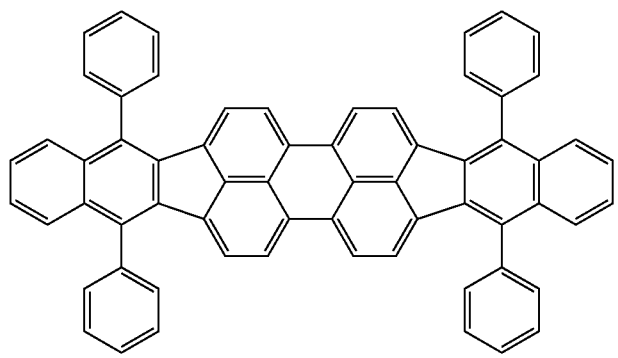
TPDBP;

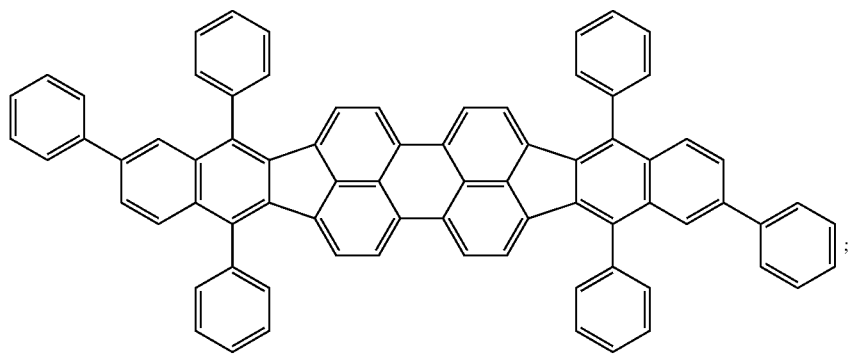
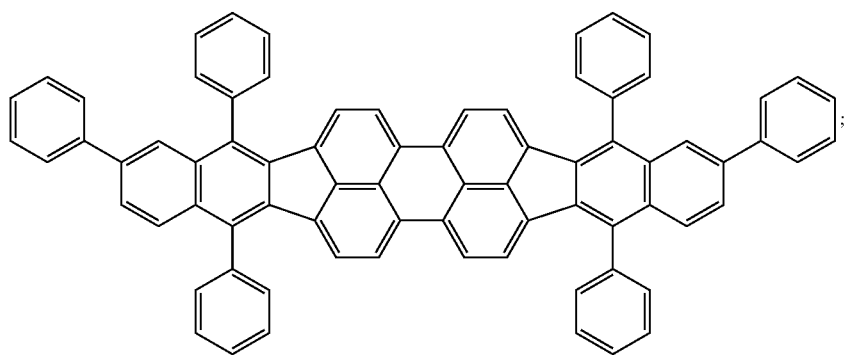
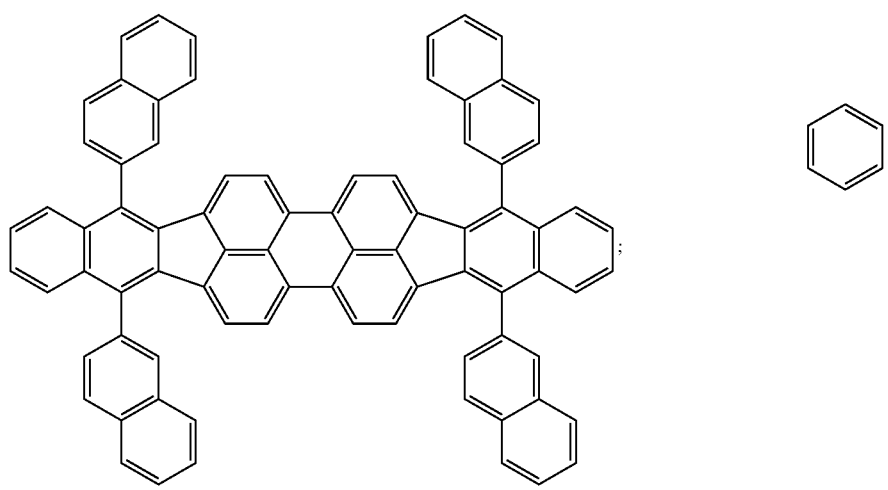
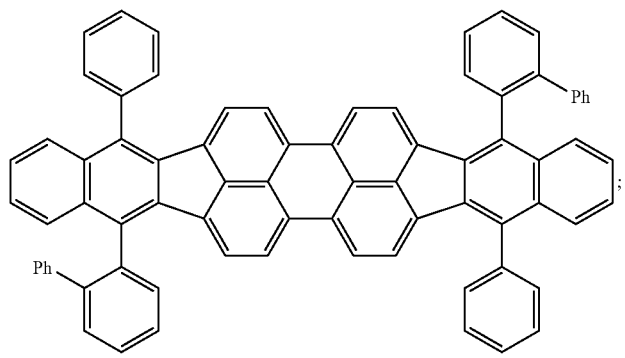

-continued
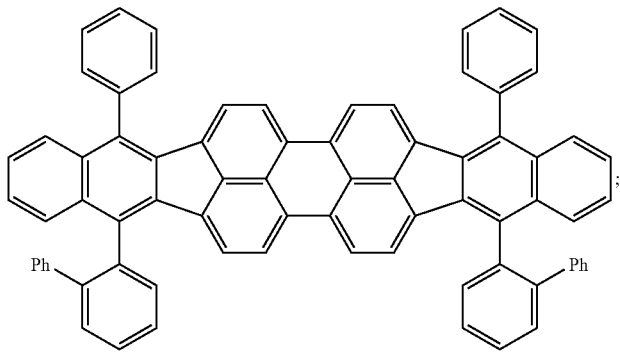
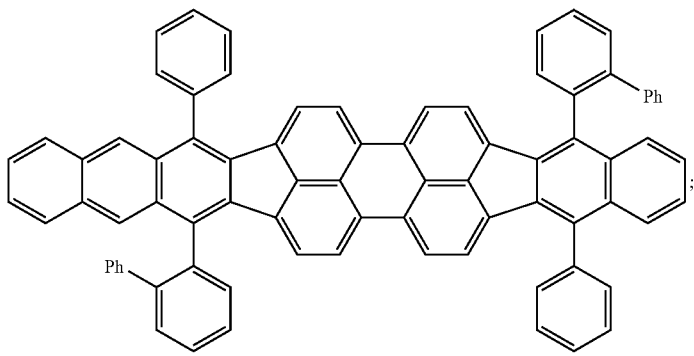
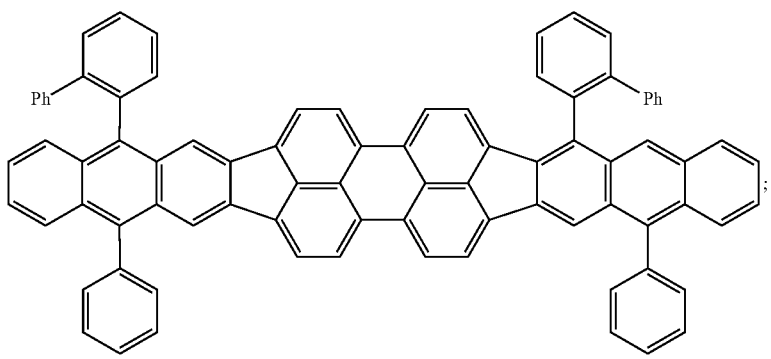
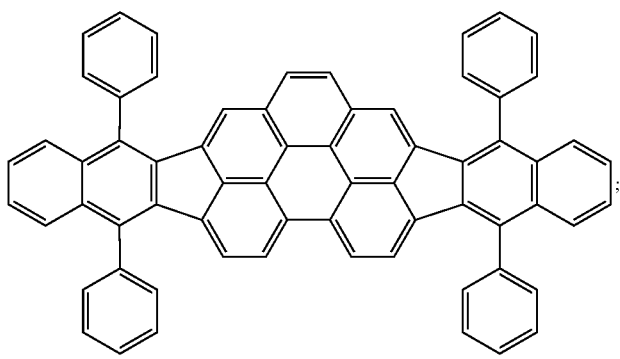

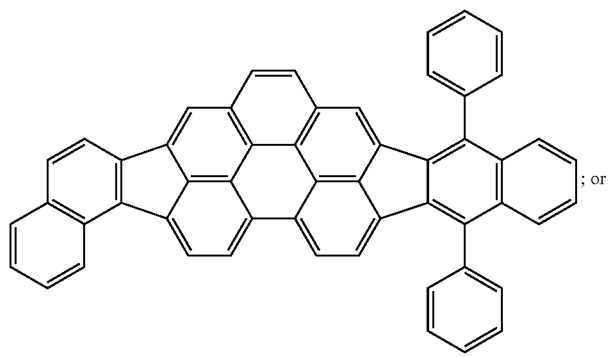

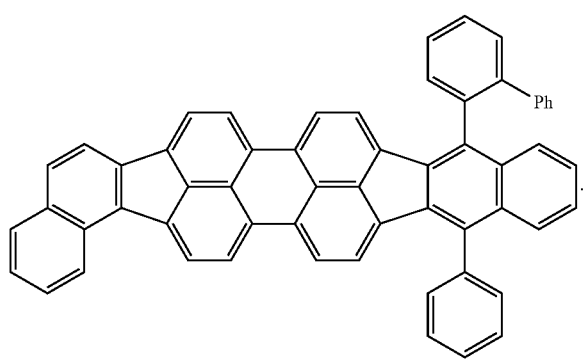

A particularly preferred diindenoperylene dopant is TPDBP (above).

It has been found useful that a blue light-emitting compound have an emission maximum between 400 nm and 490 nm, and a full width at half maximum of between 5 nm and 25 nm contained within the wavelength range of 400 nm and 490 nm. The blue light-emitting compound can include a bis(azinyl)azene boron complex compound of the structure:

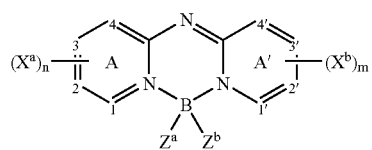

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide a full width at half maximum of between 5 nm and 25 nm contained within a wavelength range of 400 nm and 490 nm.

Some examples of the above class of dopants include the following:

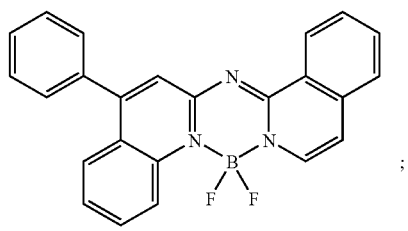

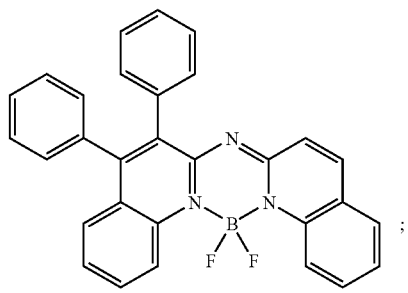

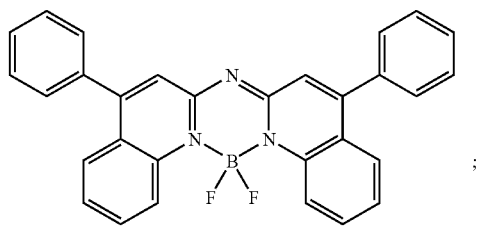

-continued

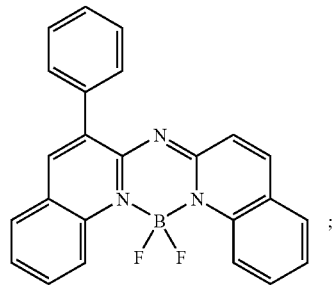

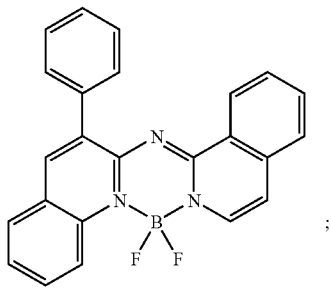

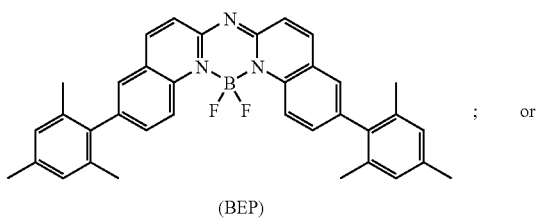

(BEP)

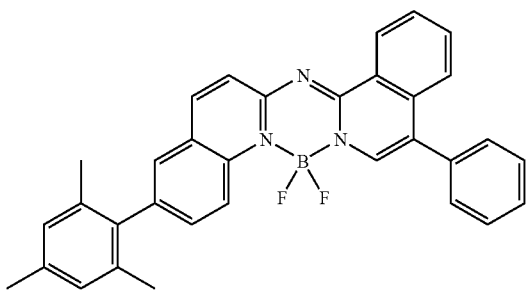

The light-emitting layer can comprise various stabilizing materials. Such materials are coated along with the host material, but at lower amounts and often have an energy bandgap between that of the primary host and that of the light-emitting dopant material. Some examples of stabilizing materials include perylenes including dibenzoperylene and diaryltetracenes, including tBuDPN, shown below

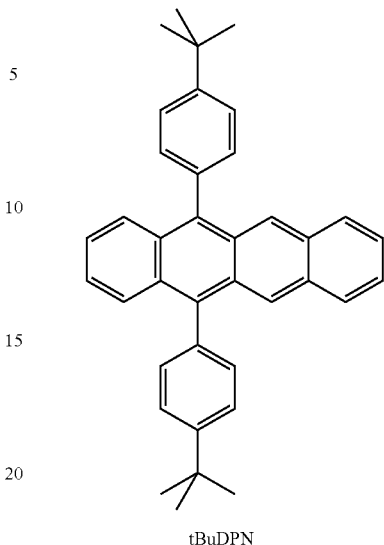

tBuDPN

While not always necessary, it is often useful that microcavity pixel 10 includes an electron-transporting layer 60 disposed over light-emitting layers 45 and 50. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 60 are metal chelated oxinoid compounds, including chelates of oxine itself, also commonly referred to as 8-quinolinol or 8-hydroxyquinoline. Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials. Related materials, denoted collectively as BAlq, can also be used as electron-transporting materials. Bryan et al., in U.S. Pat. No. 5,141,671, discuss such materials. The BAlq compounds are mixed-ligand aluminum chelates, specifically bis($R_s$-8-quinolinolato)(phenolato)aluminum(III) chelates, where $R_s$ is a ring substituent of the 8-quinolinolato ring nucleus. These compounds are represented by the formula $(R_sQ)_2AlOL$, where Q represents a substituted 8-quinolinolato ligand, $R_s$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms. These materials also make effective hole- or exciton-blocking layers for use with triplet emitting materials, as is known in the art.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

It will be understood that, as is common in the art, some of the layers can have more than one function. For example, light-emitting layers 45 and 50 can have hole-transporting properties or electron-transporting properties as desired for performance of the OLED device. Hole-transporting layer 40 or electron-transporting layer 60, or both, can also have emitting properties. In such a case, fewer layers than described above can be sufficient for the desired emissive properties, so long as two layers have the light-emitting qualities as described herein.

The organic EL media materials mentioned above are suitably deposited through a vapor phase method including sublimation, sputtering, chemical vapor deposition, and thermal transfer from a donor element. Organic EL media materials can alternatively be deposited from a fluid, for example, from a solvent with an optional binder to improve film formation. Deposition from a fluid can be done in many ways including, but not limited to ink-jet, spin coating, curtain coating, spray coating, and electrochemical deposition. If the material is a polymer, solvent deposition is usually preferred, but other methods can be used including sputtering, electrochemical deposition, electrophoretic deposition or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be premixed and coated from a single boat or donor sheet.

An electron-injecting layer 65 can also be present between the cathode and the electron-transporting layer. Examples of electron-injecting materials include alkaline or alkaline earth metals, alkali halide salts, such as LiF mentioned above, or alkaline or alkaline earth metal doped organic layers.

The second electrode, if part of an active matrix display configuration, can be a single electrode for all pixels of the display. Alternatively, the second electrode can be part of a passive matrix display, in which each second electrode can activate a column of pixels, and the second electrodes are arranged orthogonal to anodes.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Although not shown, microcavity pixel 10 can also include a color filter, which includes color filter elements for the color to be emitted from microcavity pixel 10. The color filter is constructed to pass a preselected color of light, so as to produce a preselected color output. An array of three different kinds of color filters that pass red, green, and blue light, respectively, is particularly useful in a full color OLED device. Several types of color filters are known in the art. A color filter array can be disposed in operative association with one or more of the array of light-emitting microcavity pixels, and can be formed on, in, or spaced from the OLED display. In a top-emitting configuration, the color filter can be formed on a second transparent substrate and then aligned with the pixels of the first substrate 20. An alternative type of color filter can be formed directly over the elements of a pixel. In a display comprising multiple pixels, the space between the individual color filter elements can also be filled with a black matrix to reduce pixel cross talk and improve the display's contrast. Alternatively, the color filters can be replaced with color change media (CCM). A color change medium absorbs light of one wavelength and emits light of a longer wavelength by fluorescence. Commonly, a CCM layer absorbs blue or green light and emits green or red. CCM layers can be used in conjunction with color filters.

The contrast of the display can be improved using a polarizing layer, in particular, by using a circular polarizer as is well known in the art.

Several microcavity structures are known in the art. An example of an OLED microcavity device with a thin metallic layer as the semitransparent reflector is discussed in N. Takada, T. Tsutsui, S. Saito, Appl. Phy. Lett, 63 (15), 2032–2034 (1993). Microcavity devices tend to have narrow and intense spectral emission when viewed at the normal (0 degree) viewing angle. This effect can be used to produce full color devices from a single broad spectrum emitting OLED medium such as shown in U.S. Pat. No. 5,554,911. However, as the viewing angle from the normal is increased, the spectral emission tends to shift toward lower wavelengths as illustrated in U.S. Pat. No. 5,780,174. For a green tuned microcavity, it is meant the perceived color would shift from green to blue at high angles. By incorporating a color filter element, which absorbs light at lower wavelengths, the apparent change in color can be suppressed.

In a microcavity device, the light reflective structure and semitransparent structure (e.g., reflector 90 and semitransparent reflector 25) function, with the layers between them, to form a microcavity structure. The strong optical interference in this structure results in a resonance condition wherein emission near the resonance wavelength is enhanced and emission away from the resonance wavelength is depressed. The optical path can be adjusted in thickness and refractive index to resonate at a desired wavelength. Examples of microcavity structures are shown in U.S. Pat. Nos. 6,406,801, 5,780,174, and JP 11288786. Microcavity pixel 10 can include cavity spacer layer 30 as an additional way to adjust the microcavity structure resonance wavelength. Cavity spacer layer 30 can comprise, e.g. a transparent conductive material, such as indium-tin oxide (ITO). Light that is emitted on-axis includes one or more narrow wavelength bands of light. That is, the microcavity structure enhances on-axis light produced from light-emitting layers 45 and 50 in at least one particular wavelength to produce a desired on-axis viewed color while not substantially enhancing other wavelengths of such light.

The thickness of the microcavity structure including cavity spacer layer 30 (if present) is selected to tune microcavity pixel 10 to have the resonance at the predetermined wavelength to be emitted from the device. The thickness satisfies the following equation:

$$2\Sigma n_i L_i + 2n_s L_s + (Q_{m1}+Q_{m2})\lambda/2\pi = m\lambda \qquad \text{Eq. 1}$$

wherein:

$n_i$ is the refractive index and $L_i$ is the thickness of the ith sub-layer in the microcavity structure of microcavity pixel 10;

$n_s$ is the refractive index and $L_s$ is the thickness, which can be zero, of the cavity spacer layer 30;

$Q_{m1}$ and $Q_{m2}$ are the phase shifts in radians at the two organic EL element-reflector interfaces, respectively;

$\lambda$ is the predetermined wavelength of on-axis light to be enhanced by the microcavity structure; and m is a non-negative integer.

For example, one can select the microcavity effect to enhance on-axis the emission of green light for a desired on-axis viewed color.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. Nos. 6,226,890 and 6,656,609.

In addition, inorganic and/or organic barrier layers can be coated over the OLED to provide improved sealing against moisture penetration. Alternating layers of inorganic and organic barrier layers are particularly useful.

Some examples of inorganic barrier layer materials include dielectrics such as aluminum oxide, silicon dioxide, silicon nitride, silicon oxynitride, indium-tin oxide, diamond-like carbon, and composite materials such as, for example, zinc sulfide:silicon dioxide. Such inorganic dielectric materials can form inorganic dielectric layers by condensing from the vapor phase in deposition processes which include thermal physical vapor deposition, sputter deposition, chemical vapor deposition, plasma-enhanced chemical vapor deposition, laser-induced chemical vapor deposition, induction-assisted chemical vapor deposition, electron-beam assisted vapor deposition, and atomic layer deposition processes.

In some cases, the inorganic barrier layer can include conductive metals. Examples of metals from which a metal layer can be formed by deposition from a vapor phase include, but are not limited to, aluminum, gold, silver, tantalum nitride, titanium nitride, and tungsten. These can be deposited by sputter deposition, vapor deposition, or other methods known in the art.

Organic barrier layers can include polymeric or small molecule organic materials. Preferred polymer materials for forming an organic barrier layer include parylene materials, which can be deposited from a vapor phase to provide a polymer layer having a relatively small number of defects, excellent adhesion to, and step coverage over, topological features of the OLED devices.

Figure 2:
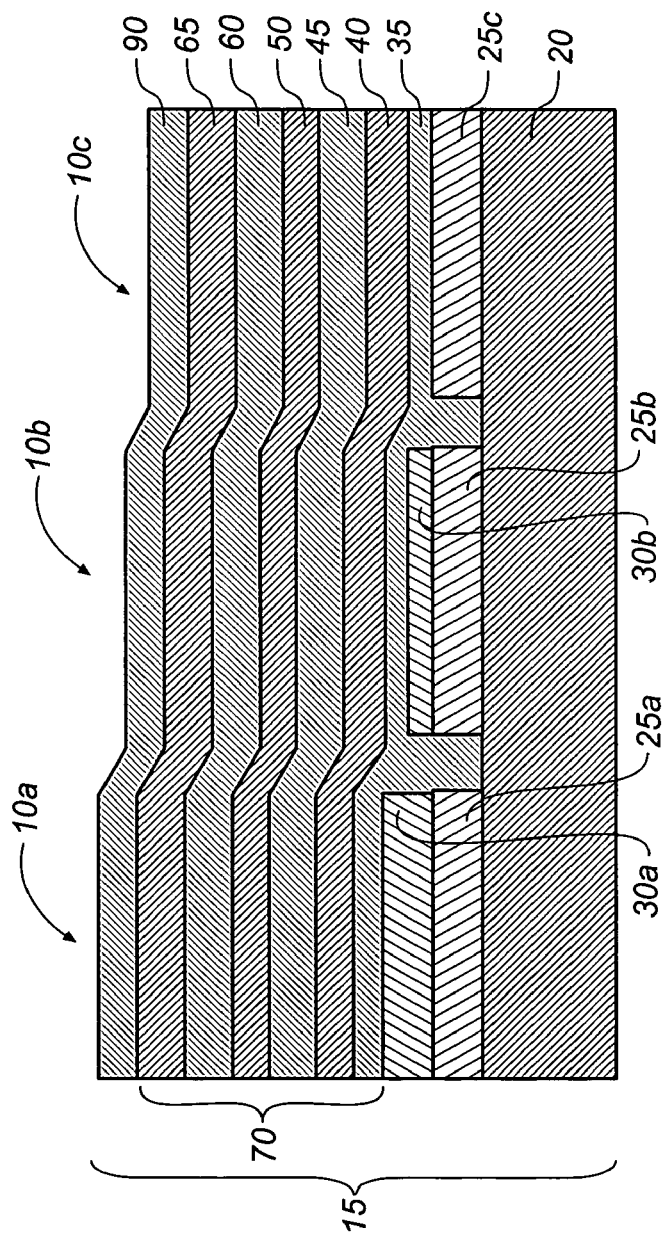
FIG. 2 is a cross-sectional view of an array of light-emitting microcavity pixels of a color OLED display according to this invention.

Turning now to FIG. 2, there is shown a cross-sectional view of a color OLED display 15 according to this invention. Color OLED display 15 comprises an array of three different colored light-emitting microcavity pixels, e.g. microcavity pixels 10a, 10b, and 10c, wherein the first and second light-emitting layers 45 and 50, respectively, are common for all different colored pixels. Each pixel has its own anode, which is capable of independently causing emission of the individual pixel. Pixel 10a further includes semitransparent reflector 25a and cavity spacer layer 30a. Pixel 10b further includes semitransparent reflector 25b and cavity spacer layer 30b. Pixel 10c further includes semitransparent reflector 25c. Semitransparent reflectors 25a, 25b, and 25c are preferably a thin transparent metal such as Ag or an alloy of Ag and is preferably between 5 nm and 35 nm in thickness. Because semitransparent reflectors 25a, 25b, and 25c are conductive, they need to be electrically isolated to permit each pixel to be driven independently. If a nonconductive material was chosen to serve the function of the semitransparent reflector, such as is the case for a quarter wave stack (QWS), then the semitransparent reflector can be configured to be common for all pixels. Cavity spacer layers 30a and 30b are preferably a transparent conductive material such as indium tin oxide (ITO) or the like. In this case, cavity spacer layers 30a and 30b serve the function of the first electrode or anode and therefore must also be electrically isolated from the other pixels. Pixel 10c is arranged so as to not need a cavity spacer layer, so that for pixel 10c, semitransparent reflector 25c is designed to serve the function of the first electrode or anode. This arrangement is preferable, in order to limit the number of patterning steps required to produce the cavity spacer layers. Alternately, in other embodiments, pixel 10c could also be supplied with a cavity spacer layer.

Each different colored microcavity pixel 10a, 10b, and 10c is tuned to produce light in one of the three different colors produced by light-emitting layers 45 and 50 so that the first, second, and third different colors are produced by color OLED display 15. For example, the thickness and refractive index of the microcavity structure of pixel 10a, including cavity spacer layer 30a, can be selected to tune the microcavity of pixel 10a to produce light of a first color of the array, which is the color produced by first light-emitting layer 45, e.g., red. Similarly, microcavity pixel 10b with cavity spacer layer 30b can be tuned to produce light of a second color of the array, which is one of the colors produced by second light-emitting layer 50, e.g., green. Microcavity pixel 10c can be tuned to produce light of a third color of the array, which is one of the colors produced by second light-emitting layer 50, e.g., blue. In this preferred embodiment, in order to reduce patterning steps, the thickness and refractive index of the organic EL element 70 is preferably tuned to be optimal for pixel 10c such that pixel 10c does not require a cavity spacer layer. The organic EL element 70 is then deposited without the need for precision shadow masking between pixels. Cavity spacer layers 30a and 30b are then separately adjusted to tune the microcavities of pixels 10a and 10b, respectively. Thus, each pixel 10a, 10b, and 10c in color OLED display 15 forms a tuned microcavity OLED device. Such a microcavity device has emission output efficiency above that of a comparable OLED device that is constructed without a microcavity. Thus, three different colors can be produced by a color OLED display 15 which includes common first and second light-emitting layers 45 and 50, respectively.

An alternative embodiment of color OLED display 15 is possible that does not include cavity spacer layers. Instead, the thickness of at least one of the organic layers other than the light-emitting layers, e.g. hole-transporting layer 40 or electron-transporting layer 60, can be changed for each different colored pixel so as to tune the microcavity to produce the desired color of light.

Color OLED display 15 can further include a color filter array as described above. The color filter array filters light corresponding to portions of the array, pixels 10a, 10b, and 10c, corresponding to the different color portions, e.g. the red, green, and blue portions.

The invention and its advantages can be better appreciated by the following comparative examples.

EXAMPLE 1 (COMPARATIVE)

A comparative color OLED display was constructed in the following manner:
1. A clean glass substrate was deposited by sputtering with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;

3. The above-prepared substrate was further treated by vacuum-depositing a 170 nm layer of 4,4'-bis[N-(1-naphthyl)-N-phenylamino]biphenyl (NPB) as a hole-transporting layer (HTL);
4. A 30 nm layer having a mixture of 24 nm NPB and 6 nm 5,12-bis(t-butylphenyl)-naphthacene (tBuDPN) containing 3% by volume 6,11-diphenyl-5,12-bis(4-(6-methyl-benzothiazol-2-yl)phenyl)naphthacene (DBzR) was vacuum-deposited onto the substrate at a coating station. The coating station includes a heated graphite boat source to form a yellow light-emitting layer (yellow LEL);
5. A coating having a mixture of 37 nm of 2-tert-butyl-9,10-bis(2-naphthyl)anthracene (TBADN) with 3 nm NPB and 2.5% by volume 4-(di-p-tolylamino)-4'-[(di-p-tolylamino)styryl]stilbene (TPDBP above) was evaporatively deposited on the above substrate to form a blue light-emitting layer (blue LEL);
6. A 10 nm electron-transporting layer (ETL) of tris(8-quinolinolato)aluminum (III) (ALQ) was vacuum-deposited onto the substrate at a coating station that included a heated tantalum boat source; and
7. A 0.5 nm layer of lithium fluoride was evaporatively deposited onto the substrate, followed by a 100 nm layer of aluminum, to form a cathode layer.

EXAMPLE 2 (COMPARATIVE)

A comparative color OLED display was constructed in the following manner:
1. A clean glass substrate was deposited by sputtering with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 120 nm layer of NPB as a hole-transporting layer (HTL);
4. A 27 nm layer having a mixture of 20 nm NPB and 7 nm rubrene containing 0.5% by volume TPDPB (above) was vacuum-deposited onto the substrate at a coating station that included a heated graphite boat source to form a red light-emitting layer (red LEL);
5. A coating having a mixture of 10 nm of TBADN and 10 nm ALQ with 0.5% by volume DPQA was evaporatively deposited on the above substrate to form a green light-emitting layer (green LEL);
6. A coating having a mixture of 20 nm of TBADN with 1 nm NPB and 0.75% by volume BEP was evaporatively deposited on the above substrate to form a blue light-emitting layer (blue LEL);
7. A 20 nm electron-transporting layer (ETL) of ALQ was vacuum-deposited onto the substrate at a coating station that included a heated graphite boat source; and
8. A 0.5 nm layer of lithium fluoride was evaporatively deposited onto the substrate, followed by a 100 nm layer of aluminum, to form a cathode layer.

EXAMPLE 3 (INVENTIVE)

An inventive color OLED display was constructed in the following manner:
1. A clean glass substrate was deposited by sputtering with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 90 nm layer of NPB as a hole-transporting layer (HTL);
4. A 150 nm layer having a mixture of 107 nm NPB and 43 nm rubrene containing 0.5% by volume TPDPB (above) was vacuum-deposited onto the substrate at a coating station that included a heated graphite boat source to form a red light-emitting layer (red LEL);
5. A coating having a mixture of 40 nm of TBADN with 4 nm NPB and 3% by volume L47 was evaporatively deposited on the above substrate to form a blue and green light-emitting layer (blue and green LEL); and
6. A 10 nm electron-transporting layer (ETL) of ALQ was vacuum-deposited onto the substrate at a coating station that included a heated graphite boat source.

EXAMPLE 4 (INVENTIVE)

An inventive color OLED display was constructed in the manner described in Example 3, except that the following steps were changed:
3. The above-prepared substrate was further treated by vacuum-depositing a 260 m layer of NPB as a hole-transporting layer (HTL);
4. A layer of 30 nm NPB containing 3.5% by volume L50 (above) was vacuum-deposited onto the substrate at a coating station that included a heated graphite boat source to form a red light-emitting layer (red and yellow LEL);
5. A coating having a mixture of 42 nm of BNA (above) with 3 nm NPB and 1% by volume BEP was evaporatively deposited on the above substrate to form a blue light-emitting layer (blue LEL); and
6. A 10 nm electron-transporting layer (ETL) of ALQ was vacuum-deposited onto the substrate at a coating station that included a heated graphite boat source.

The devices were tested by applying a current across the electrodes of 20 mA/cm$^2$ and measuring the emission spectrum. These spectra are shown in FIGS. 3A, 4A, 5A, and 6A for examples 1 to 4, respectively. The $\lambda_{max}$ 105 is one wavelength of maximum emission, e.g. 472 nm, in FIG. 3A. Full width at half maximum 110 is defined as the width of a given peak at one-half its maximum value. For example, the blue peak in FIG. 3A has a radiance maximum of 0.57 ($\lambda_{max}$ 105). The width of this peak at radiance 0.28 (full width at half maximum 110) is 60 nm (approximately 460 to 520 nm). The relative luminous efficiency is defined as the luminous efficiency of the example device, in cd/A, divided by the luminous efficiency in, cd/A, of reference Example 1. The relative power consumption is defined as the power consumption of the example device, in watts (W), divided by the power consumption, in W, of reference Example 1. The power consumption was calculated, in W, for a full color display showing D65 white at 120 cd/m2. For lifetime, the intensity was monitored as a function of time at a constant current of 80 ma/cm$^2$. The relative lifetime is defined as the time to half-luminance intensity of the example device, in hours, divided by the time to half-luminance intensity of the reference comparative example. Table 1 below shows the results.

TABLE 1

|  | Example 1 (Comparative) | Example 2 (Comparative) | Example 3 (Inventive) | Example 4 (Inventive) |
|---|---|---|---|---|
| Red dopant | — | 0.5% TPDPB | 0.5% TPDPB | 3.5% L50 |
| Yellow dopant | 3% DBzR | — | — | — |
| Blue-Green dopant | — | — | 3% L47 | — |
| Green dopant | — | 0.5% DPQA | — | — |
| Blue host | TBADN | TBADN | TBADN | BNA |
| Blue dopant | 2.5% L47 | 0.75% BEP | — | 1% BEP |
| Emitting layer order (bottom to top) | YB | RGB | R-BG | YB |
| Relative White Luminous Efficiency | 1 | .63 | .83 | .82 |
| Relative Power Consumption | 1 | 1.19 | 1.06 | .83 |
| Red $\lambda_{max}$ | — | 608 nm | 608 nm | — |
| Red full width at half maximum | — | 28 nm | 28 nm | — |
| Red FWHM Range | — | 592–620 nm | 592–620 nm | — |
| Green $\lambda_{max}$ | — | 520 nm | — | — |
| Green full width at half maximum | — | 28 nm | — | — |
| Green FWHM Range | — | 507–535 nm | — | — |
| Blue $\lambda_{max}$ | — | 452 nm | — | 452 nm |
| Blue full width at half maximum | — | 12 nm | — | 12 nm |
| Blue FWHM Range | — | 446–458 nm | — | 446–458 nm |
| Blue-Green $\lambda_{max}$ | 472 nm | — | 472 nm | — |
| Blue-Green full width at half maximum | 60 nm | — | 60 nm | — |
| Blue-Green FWHM Range | 460–520 nm | — | 460–520 nm | — |
| Yellow $\lambda_{max}$ | 572 nm | — | — | 571 nm |
| Yellow full width at half maximum | 84 nm | — | — | 72 nm |
| Yellow FWHM Range | 546–630 nm | — | — | 542–614 nm |

The above examples were constructed in a non-microcavity architecture, which does not contain a reflective semitransparent structure, so as to obtain the full emission spectrum of the white OLED. The properties of the example devices above were then modeled in a microcavity device comprising a reflective semitransparent structure. The electroluminescence (EL) spectrum produced by a given device is predicted using an optical model that solves Maxwell's Equations for emitting dipoles of random orientation in a planar multilayer device (O. H. Crawford, *J. Chem. Phys.* 89, p 6017, 1988; K. B. Kahen, *Appl. Phys. Lett.* 78, p 1649, 2001). The innate spectrum of the dipole emitters is determined ("back-derived") from the EL spectrum of each of the comparative and inventive example devices above. This innate spectrum, along with the optical response of the microcavity device structure, is then used to predict the EL spectrum of the microcavity devices. For the purposes of the model, this emission is assumed to occur uniformly in the first 10 nm of the second emitting-layer in a two- or three-emitter layer structure. For each layer, the model uses wavelength-dependent complex refractive indices that are either measured by spectroscopic ellipsometry or taken from the literature (Handbook of Optical Constants of Solids, ed. by E. D. Palik, Academic Press, 1985; Handbook of Optical Constants of Solids II, ed. by E. D. Palik, Academic Press, 1991; CRC Handbook of Chemistry and Physics, 83rd ed., edited by D. R. Lide, CRC Press, Boca Raton, 2002). Once the EL spectrum has been derived, it is straightforward to compute the luminance (up to a constant factor) and the CIE chromaticities of this spectrum. Numerous comparisons between predicted EL spectra and measured EL spectra have confirmed that the model predictions are very accurate. This permitted calculation of the 1931 CIE x,y-chromaticity diagram coordinates and luminous efficiency, in cd/A, for red-, green-, and blue-tuned microcavity pixels through representative red, green, and blue color filters, as well as the composite white coordinates and luminance, at viewing angles from 0° to 60°. The red, green, and blue coordinates at 0° viewing angle are shown in FIGS. 3B, 4B, 5B, and 6B for examples 1 to 4, respectively, which represent the color gamuts 115, 120, 125, and 130, respectively, of the devices. The data for white is for a recombination of red, green, and blue light emitted through the microcavity structure and the appropriate color filter to make D65 white with 120 cd/m² luminance in the on-axis direction. The results of modeling are also shown in Table 2 below. Relative luminous efficiency is defined as the luminous efficiency of the color in the example device divided by the luminous efficiency of that color in device Example 1.

TABLE 2

|  | Example 1 (Comparative) | Example 2 (Comparative) | Example 3 (Inventive) | Example 4 (Inventive) |
|---|---|---|---|---|
| Red (CIEx,y) | 0.623, 0.371 | 0.635, 0.348 | 0.647, 0.348 | 0.616, 0.347 |
| Relative red luminous efficiency | 1 | 0.67 | 1.08 | .63 |
| Green (CIEx,y) | 0.329, 0.627 | 0.203, 0.713 | 0.162, 0.666 | 0.390, 0.584 |
| Relative green luminous efficiency | 1 | 0.77 | .67 | 1.11 |
| Blue (CIEx,y) | 0.120, 0.100 | 0.144, 0.059 | 0.105, 0.154 | 0.147, 0.040 |
| Relative blue luminous efficiency | 1 | 0.58 | 1.56 | .65 |
| White (CIEx,y) | 0.355, 0.399 | 0.274, 0.336 | 0.371, 0.376 | 0.317, 0.290 |

Figure 5A:
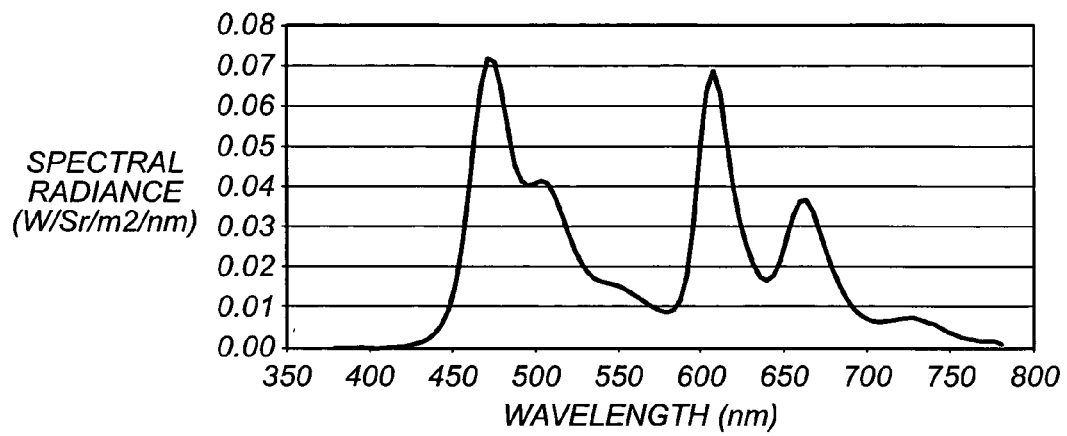
FIG. 5A is an emission spectrum of a first white light-emitting OLED device according to this invention.
Figure 5B:
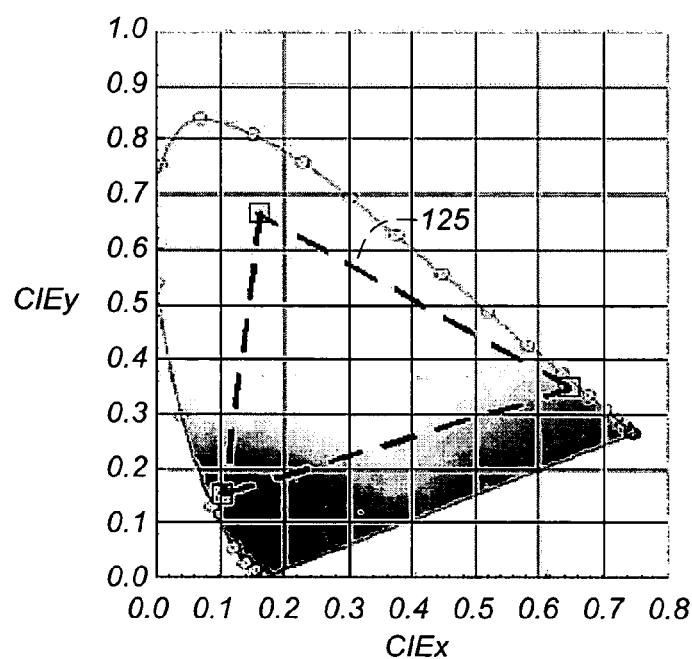
FIG. 5B is a 1931 CIE x,y-chromaticity diagram showing the color gamut modeled with the above first white light-emitting OLED device.
Figure 6A:
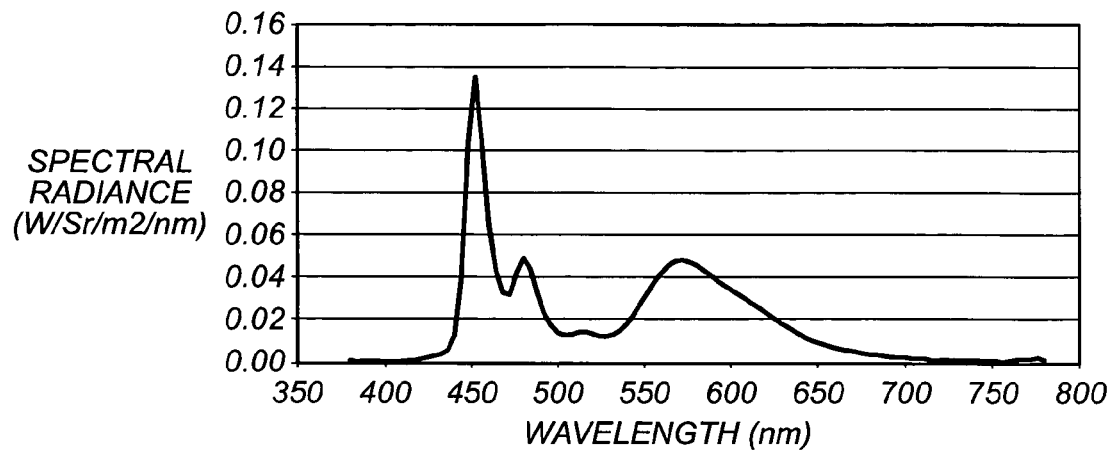
FIG. 6A is an emission spectrum of a second white light-emitting OLED device according to this invention.
Figure 6B:
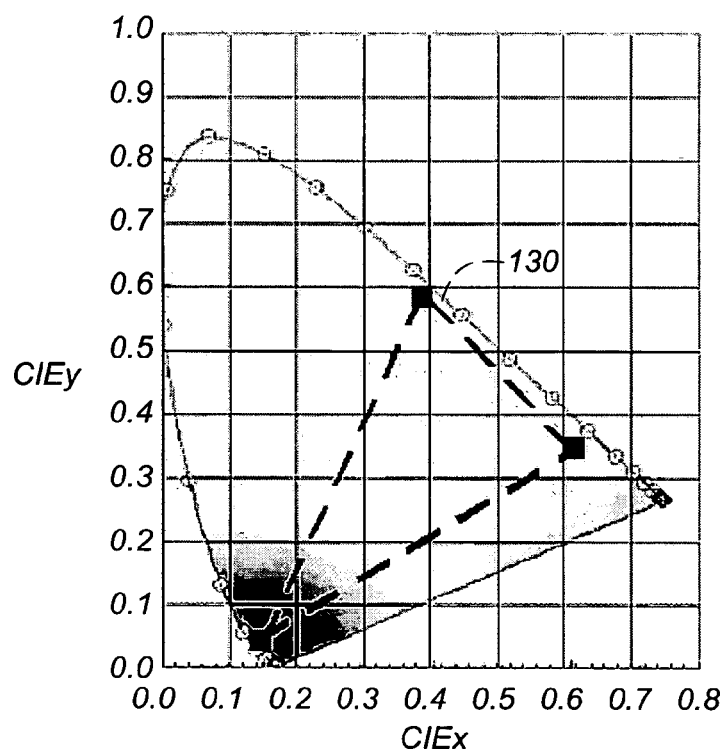
FIG. 6B is a 1931 CIE x,y-chromaticity diagram showing the color gamut modeled with the above second white light-emitting OLED device.

These results show several advantages of this invention. FIGS. 5B and 6B show that, in comparison to Example 1 (FIG. 3B), the invention has a larger color gamut. Table 2 and FIGS. 5B and 6B show that better primary colors can be achieved with this invention, in comparison to Example 1 (FIG. 3B), particularly the blue primary for Example 4 and the green primary for Example 3. Comparative Example 2 has excellent color gamut, but higher power consumption. Table 1 shows that lower power consumption than Example 2 can be achieved with this invention, while still maintaining a large color gamut and saturated primaries.

The invention has been described in detail with particular reference to certain preferred embodiments thereof, but it will be understood that variations and modifications can be effected within the spirit and scope of the invention.

PARTS LIST 10 microcavity pixel
10a microcavity pixel
10b microcavity pixel
10c microcavity pixel
15 color OLED display
20 substrate
25 semitransparent reflector
25a semitransparent reflector
25b semitransparent reflector
25c semitransparent reflector
30 cavity spacer layer
30a cavity spacer layer
30b cavity spacer layer
35 hole-injecting layer
40 hole-transporting layer
45 first light-emitting layer
50 second light-emitting layer
60 electron-transporting layer
65 electron-injecting layer
70 organic EL element
90 reflector
105 $\lambda_{max}$
110 full width at half maximum
115 color gamut
120 color gamut
125 color gamut
130 color gamut

What is claimed is:

1. A color OLED display having at least three different colored microcavity pixels, each including a light reflective structure and a semi-transparent structure, comprising:
    a) an array of light-emitting microcavity pixels each having one or more common organic light-emitting layers, said light-emitting layer(s) including first and second light-emitting materials, respectively, that produce different light spectra, the first light-emitting material producing light having a first spectrum portion that extends between first and second different colors of the array, and the second light-emitting material producing light having a second spectrum portion that is substantially contained within a third color that is different from the first and second colors; and
    b) each different colored pixel being tuned to produce light in one of the three different colors whereby the first, second, and third different colors are produced by the OLED display.

2. The OLED display of claim 1 wherein the first and second light-emitting materials are contained in separate layers and wherein the blue-green light-emitting layer includes a first host and a blue-green light-emitting compound, and the red light-emitting layer includes a second host and a red light-emitting compound.

3. The color OLED display of claim 2 wherein the first host comprises a mixture of host materials.

4. The color OLED display of claim 2 wherein the second host comprises a mixture of host materials.

5. The color OLED display of claim 2 wherein the red light-emitting compound has a full width at half maximum contained within the wavelength range of 560 nm and 700 nm.

6. The color OLED display of claim 5 wherein the red light-emitting compound has a full width at half maximum of between 5 and 90 nm.

7. The color OLED display of claim 2 wherein the red light-emitting compound is a diindenoperylene compound.

8. The color OLED display of claim 7 wherein the diindenoperylene compound has the following structure

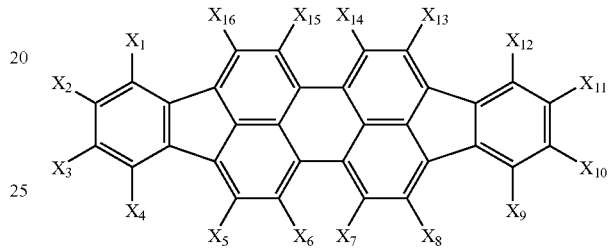

wherein $X_1$–$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide a full width at half maximum of 5 nm to 90 nm contained within the wavelength range of 560 nm and 700 nm.

9. The color OLED display of claim 8 wherein the diindenoperylene compound is

10. The OLED display of claim 2 wherein the blue-green light-emitting compound is a distyrylamine derivative.

11. The OLED display of claim 1 wherein the first and second light-emitting materials are contained in separate layers and wherein the yellow-orange light-emitting layer includes a first host and a yellow light-emitting compound, and the blue light-emitting layer includes a second host and a blue light-emitting compound.

12. The color OLED display of claim 11 wherein the first host comprises a mixture of host materials.

13. The color OLED display of claim 11 wherein the second host comprises a mixture of host materials.

14. The color OLED display of claim 11 wherein the blue light-emitting compound has a full width at half maximum contained within the wavelength range of 400 nm and 490 nm.

15. The color OLED display of claim 14 wherein the blue light-emitting compound has a full width at half maximum of between 5 and 25 nm.

16. The color OLED display of claim 11 wherein the blue light-emitting compound is a bis(azinyl)azene boron complex.

17. The color OLED display of claim 16 wherein the bis(azinyl)azene boron complex has the following structure

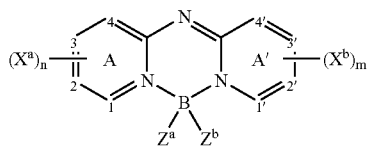

wherein:
  A and A' represent independent azine ring systems corresponding to 6-membered aromatic ring systems containing at least one nitrogen;
  $(X^a)_n$ and $(X^b)_m$ represent one or more independently selected substituents and include acyclic substituents or are joined to form a ring fused to A or A';
  m and n are independently 0 to 4;
  $Z^a$ and $Z^b$ are independently selected substituents;
  1, 2, 3, 4, 1', 2', 3', and 4' are independently selected as either carbon or nitrogen atoms; and
  provided that $X^a$, $X^b$, $Z^a$, and $Z^b$, 1, 2, 3, 4, 1', 2', 3', and 4' are selected to provide an a full width at half maximum of between 5 and 25 nm contained within the wavelength range of 400 nm and 490 nm.

18. The color OLED display of claim 17 wherein the bis(azinyl)azene boron complex is

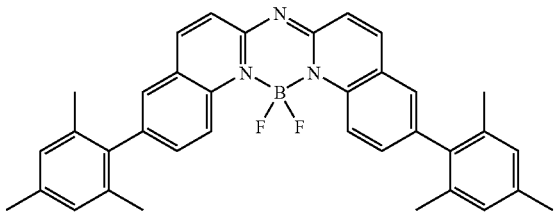

19. The OLED display of claim 11 wherein the yellow light-emitting compound includes a tetracene derivative.

20. The OLED device of claim 1 where the reflector, the semitransparent reflector, or both, also serve as electrodes for the light-emitting layers.

21. The color OLED display of claim 1 wherein the material for reflector includes Ag, Au, Al, or alloys thereof.

22. The color OLED display of claim 1 wherein the material for the semitransparent reflector includes Ag, Au, or alloys thereof.

23. The color OLED display of claim 1 wherein at least two of the different colored microcavity pixels further include a cavity spacer layer wherein the thickness of the cavity spacer layer is different for each of said different colored microcavity pixels.

24. The color OLED display of claim 1 wherein the semitransparent reflector is disposed between the light-emitting layers and the substrate.

25. The color OLED display of claim 1 wherein the reflector is disposed between the light-emitting layers and the substrate.

26. The color OLED display of claim 1 wherein the thickness of at least one of the organic layers other than the light-emitting layers is changed for each different colored pixel.

27. The color OLED display of claim 1 further including a color filter array disposed in operative association with one or more of the array of light-emitting microcavity pixels that filters light corresponding to the portions of the array corresponding to the red, green, and blue portions.

28. The color OLED display of claim 11 wherein at least one of the hosts is an anthracene derivative having the following formula:

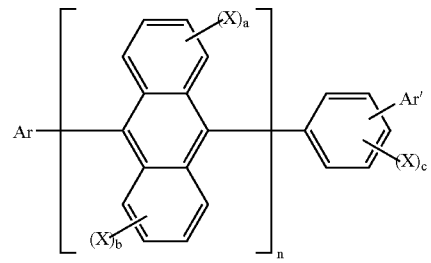

wherein:
  Ar is an (un)substituted condensed aromatic group of 10–50 nuclear carbon atoms;
  Ar' is an (un)substituted aromatic group of 6–50 nuclear carbon atoms;
  X is an (un)substituted aromatic group of 6–50 nuclear carbon atoms, (un)substituted aromatic heterocyclic group of 5–50 nuclear carbon atoms, (un)substituted alkyl group of 1–50 carbon atoms, (un)substituted alkoxy group of 1–50 carbon atoms, (un)substituted aralkyl group of 6–50 carbon atoms, (un)substituted aryloxy group of 5–50 nuclear carbon atoms, (un) substituted arylthio group of 5–50 nuclear carbon atoms, (un)substituted alkoxycarbonyl group of 1–50 carbon atoms, carboxy group, halogen atom, cyano group, nitro group, or hydroxy group;
  a, b, and c are whole numbers of 0–4;
  n is a whole number of 1–3; and
  when n is 2 or more, the formula inside the parenthesis shown below can be the same or different:

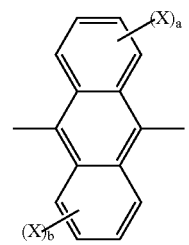

29. The color OLED display of claim 28 wherein Ar in general formula (1) is selected from the general formulas given below:
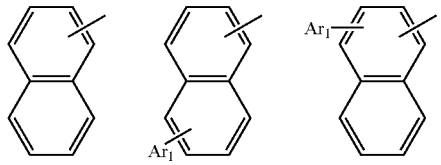
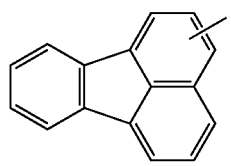
wherein Ar₁ is an (un)substituted aromatic group of 6–50 nuclear carbon atoms.
30. The color OLED display of claim 28 wherein the host is selected from:
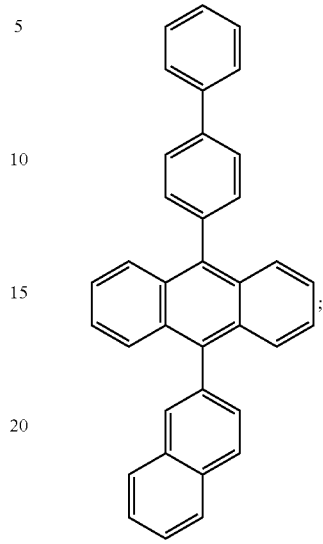
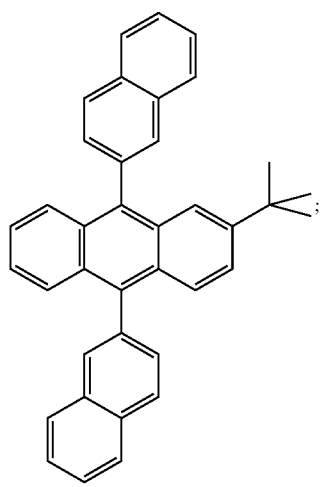
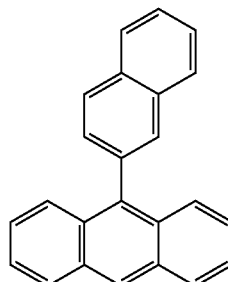
-continued
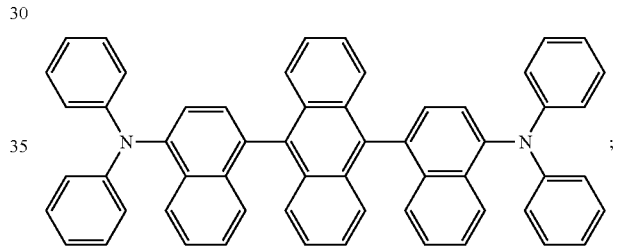
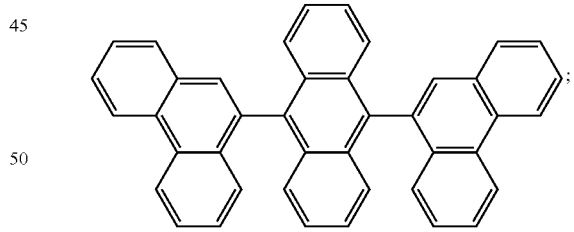
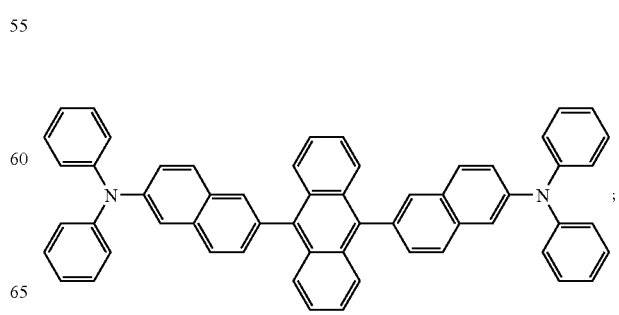
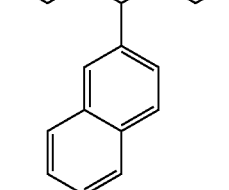

-continued
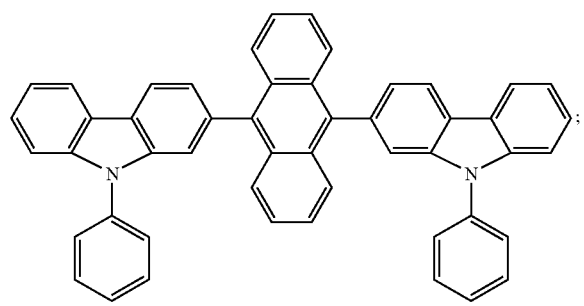;
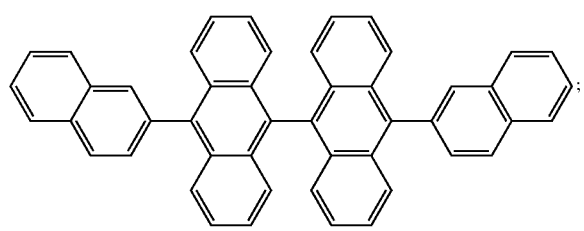;
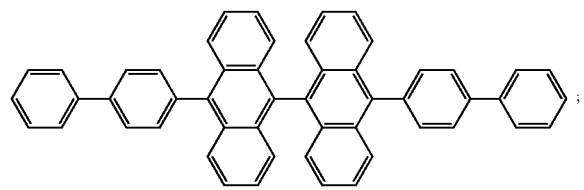;
-continued
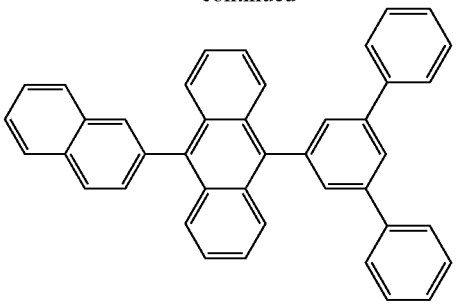;
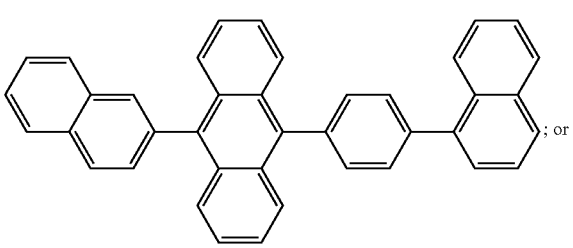; or
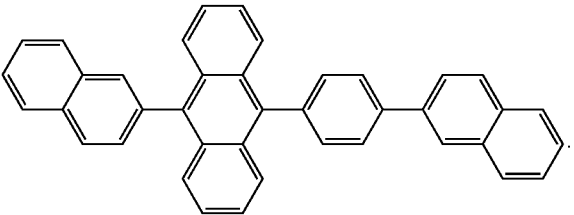.
* * * * *